(12) United States Patent
Van De Putte et al.

(10) Patent No.: US 12,183,561 B2
(45) Date of Patent: Dec. 31, 2024

(54) COVER WITH A SENSOR SYSTEM FOR A CONFIGURABLE MEASURING SYSTEM FOR A CONFIGURABLE SPUTTERING SYSTEM

(71) Applicant: SOLERAS ADVANCED COATINGS BVBA, Deinze (BE)

(72) Inventors: Ivan Van De Putte, Waregem (BE); Niek Dewilde, Kruishoutem (BE); Guy Gobin, Ostend (BE); Wilmert De Bosscher, Drongen (BE)

(73) Assignee: SOLERAS ADVANCED COATINGS BV, Deinze (BE)

( * ) Notice: Subject to any disclaimer, the term of this patent is extended or adjusted under 35 U.S.C. 154(b) by 944 days.

(21) Appl. No.: 15/109,202

(22) PCT Filed: Dec. 21, 2015

(86) PCT No.: PCT/EP2015/080897
§ 371 (c)(1),
(2) Date: Jun. 30, 2016

(87) PCT Pub. No.: WO2016/110407
PCT Pub. Date: Jul. 14, 2016

(65) Prior Publication Data
US 2016/0362780 A1    Dec. 15, 2016

(30) Foreign Application Priority Data
Jan. 11, 2015    (BE) .................................... 2015/5011

(51) Int. Cl.
*H01J 37/34*    (2006.01)
*C23C 14/34*    (2006.01)
(Continued)

(52) U.S. Cl.
CPC ...... *H01J 37/3476* (2013.01); *C23C 14/3492* (2013.01); *C23C 14/547* (2013.01);
(Continued)

(58) Field of Classification Search
CPC ... C23C 14/542; C23C 14/545; C23C 14/546; C23C 14/547; C23C 14/548;
(Continued)

(56) References Cited

U.S. PATENT DOCUMENTS 4,311,725 A * 1/1982 Holland ................ C23C 14/546
118/664
4,975,168 A * 12/1990 Ohno ................... C23C 14/0042
204/192.13

(Continued)

FOREIGN PATENT DOCUMENTS

WO    2013120920 A1    8/2013
WO    2014105557 A1    7/2014

OTHER PUBLICATIONS

'Sensor' definition. Google Dictionary [Accessed on 828/2019].*
(Continued)

*Primary Examiner* — Michael A Band
(74) *Attorney, Agent, or Firm* — Workman Nydegger

(57) ABSTRACT

A cover for a configurable measuring system of a configurable sputtering system which is adapted for sputtering multilayer coatings with varying compositions and comprising a plurality of sputtering zones and having a plurality of apertures on which the cover is detachably attachable, and wherein the cover comprises a sensor system for in situ detection of a property of the multilayer coating on a substrate, wherein said at least one sensor system is attached to the cover.

24 Claims, 11 Drawing Sheets

(51) Int. Cl.
*C23C 14/54* (2006.01)
*H01J 37/32* (2006.01)

(52) U.S. Cl.
CPC .. *H01J 37/32899* (2013.01); *H01J 37/32935* (2013.01); *H01J 37/32972* (2013.01); *H01J 37/3299* (2013.01); *H01J 37/3411* (2013.01); *H01J 37/347* (2013.01); *H01J 37/3473* (2013.01)

(58) Field of Classification Search
CPC ..... C23C 14/3492; C23C 14/52; C23C 14/54; C23C 14/543; C23C 14/544; H01J 37/3476; H01J 37/3411; H01J 37/34; H01J 37/3299; H01J 37/32972; H01J 37/32935; H01J 37/32899; H01J 37/347; H01J 37/3479; H01J 37/3482; H01J 37/3485; H01J 37/3473
See application file for complete search history.

(56) References Cited

U.S. PATENT DOCUMENTS

| | | | | |
|---|---|---|---|---|
| 5,209,830 A * | 5/1993 | Martens | ................ | G01J 1/04 204/192.13 |
| 5,893,050 A * | 4/1999 | Park | ................ | C23C 16/52 702/97 |
| 5,940,175 A * | 8/1999 | Sun | ................ | G01N 21/9501 356/237.3 |
| 6,103,069 A * | 8/2000 | Davenport | ............ | C23C 14/566 204/192.12 |
| 6,226,086 B1 * | 5/2001 | Holbrook | ........... | G01B 11/0616 356/630 |
| 6,866,255 B2 * | 3/2005 | Fork | ................ | C23C 14/14 257/181 |
| 10,153,143 B2 * | 12/2018 | Binns | ................ | H01J 37/3476 |
| 2006/0081459 A1 * | 4/2006 | Tsai | ................ | C23C 14/35 204/192.13 |
| 2006/0260938 A1 * | 11/2006 | Petrach | ................ | C23C 14/568 204/298.16 |
| 2012/0041583 A1 | 2/2012 | Conley et al. | | |
| 2014/0186975 A1 * | 7/2014 | Buller | ................ | H02S 50/00 438/7 |
| 2015/0348773 A1 * | 12/2015 | Zhu | ................ | H01J 37/3426 438/503 |

OTHER PUBLICATIONS

Belgium Search Report for corresponding Belgium Application No. 2015/5011, Aug. 4, 2015.
International Search Report for corresponding International PCT Application No. PCT/EP2015/080897, Mar. 23, 2016.

* cited by examiner

One Ag low-E (SLE)

Double Ag low-E (DLE)

Triple Ag low-E (TLE)

COVER WITH A SENSOR SYSTEM FOR A CONFIGURABLE MEASURING SYSTEM FOR A CONFIGURABLE SPUTTERING SYSTEM

FIELD OF THE INVENTION

The present invention relates generally to the field of sputtering devices and methods of sputtering, especially with respect to sputtering of coatings with multiple layers, e.g. at least three, at least six or even at least ten layers or more. More specifically, the present invention relates to a movable, e.g. removable cover to which is mounted a sensor system with at least one sensor, to a configurable measuring system that comprises such a cover with sensor system, and to a configurable sputtering system that comprises such a measurement system. The invention also relates to a method for configuring a configurable measuring system and to a method of applying a multilayer coating on a substrate, and to a computer program product for measuring, analysing, and controlling a multilayer coating.

BACKGROUND OF THE INVENTION

The technique of material depositing by means of sputtering has been known for decades already and therefore does not need to be further explained. Suffice it to say that typically a plasma is generated in a low-pressure chamber in which an inert gas such as argon, or an active gas such as oxygen or nitrogen is present for depositing a layer of the sputtering material on a 'substrate', and that a high voltage is applied across a so-called 'sputtering target' or 'magnetron' (which contains the material that is to be sputtered). The argon atoms are ionised and the sputtering target is bombarded with argon ions, causing atoms to be detached from the sputtering target, and deposited on the substrate.

Coatings may consist of one layer of deposited material, or of several layers, e.g. three or six or ten or fourteen, or even more than fourteen layers of various materials which are deposited on top of each other. By a suitable selection of the thickness of each layer, and by a suitable choice of material, custom coating stacks can be obtained, with very specific properties. However, it is a technical challenge to obtain the envisioned specific properties due to the challenge of controlling mechanical properties of the layers, e.g. thickness of each layer, for each individual layer in a production batch. It is even more challenging to moreover also obtain uniform properties over relatively large surface areas, such as e.g. monitors or windscreens of cars, or glass for windows for a house or office building.

FIG. 1(b) to (d) shows an example of a particular category of known coating stacks with very interesting properties, known under the name low-E stacks' (low emissivity stack), which are used for windows of buildings. There are several common configurations: (b) a stack with six layers comprising a single silver layer (called 'SLE', which stands for 'Single Ag Low-E'), (c) a stack with ten layers comprising two silver layers (called 'IDLE', which stands for 'Double Ag Low-E'), and (d) a stack with fourteen layers comprising three silver layers ('TLE', which stands for 'Triple Ag Low-E'). These stacks offer the advantage that they largely let through the visible sunlight, but largely reflect the infrared light (both the IR light coming from the sun, and the IR light emanating from objects in the living room or office), as shown in FIG. 1(a). In this way the heat in the summer can largely be kept outside, and the heat in the winter can mostly be kept indoors, and one can still see through the window.

The Low-E property of the TLE stack is thereby more favourable than that of the DLE stack, which in turn is more favourable than the SLE stack, which in turn is more favourable than non-coated glass, as shown in FIG. 2, but the TLE stack is of course harder to manufacture, and therefore also more expensive. It turns out that a small deviation in the thickness of any single layer can result in a significant deviation of the reflection colour of the entire low-E stack. While a maximum allowed deviation of the individual layer thicknesses is approximately 4% for the SLE stack, this is only about 2% for a DLE stack, and only about 1% for a TLE stack. It is a serious technical challenge to obtain such tolerances, especially when the substrates have relatively large dimensions (e.g. more than 1 m or even more than 2 m wide and having a length greater than the width), especially keeping in mind that the typical installations where such stacks are applied are very flexibly laid out, and may have as many as 50 sputtering stations (which, however, are not all actually used for each product), for sputtering up to as many as 20 different materials, configured to produce a batch of products with a coating stack according to the specifications of the customer.

In WO2014/105557A1 of First Solar Inc., a sputtering installation is described that is optimised to produce one specific, fixed coating stack of three layers for photovoltaic devices. This sputtering installation 300 is schematically shown in FIG. 3, which is a replica of FIG. 2 from WO2014/105557A1, and comprises an ex situ sensor system 310 at the end of the production line in order to measure properties of the complete coating, as well as two in situ measuring systems 311, 312 for measuring the property of a partial coating stack with one layer and two layers, respectively, after the application of each layer. The measurement data is collected by a computer system with a software package for optical modelling that is able to calculate the most likely actual layer thickness of each deposited layer, making use of so-called 'curve-fitting techniques' on the basis of the spectral measurement data from the ex situ measurement system 310, and on the basis of the in situ sensor systems 311, 312, and on the basis of the parameters of the coating stack to be produced (e.g., the materials and the envisioned thickness of each layer), and from known material properties. The power of the sputtering targets can be adjusted on the basis of the calculated average layer thicknesses. This solution, however, is not readily applicable, let alone the most appropriate, for a configurable sputtering installation as described above, which is required to produce relatively small series of coating stacks with very different compositions. There is therefore certainly room for alternatives and/or improvements.

SUMMARY OF THE INVENTION

It is an object of the present invention to provide a good solution or good partial solution for improving the control of the sputtering of multilayer coatings on a substrate, such as glass.

It is an object of particular embodiments of the present invention to offer a good solution for allowing measuring and/or analysing a configurable coating stack having multiple layers in a flexible manner, in particular for a configurable or reconfigurable sputtering system.

It is also an object of particular embodiments of the present invention to provide a good and flexible measuring system, or parts thereof, for measuring a configurable or reconfigurable coating stack with multiple layers, in particular in a configurable or reconfigurable sputtering system.

It is also an object of particular embodiments of the present invention to provide a good and flexible configurable or reconfigurable sputtering system, with which various coating stacks of multiple layers (e.g. at least three, or at least six, or at least ten layers) can be produced within predefined tolerances, e.g. of approximately +/−1% variation of the layer thicknesses or better, in an economically feasible manner.

It is also an object of particular embodiments of the present invention to provide a good and flexible configurable sputtering system with which coating stacks of multiple layers can be produced within predefined tolerances that apply over the whole area of the substrate.

It is also an object of particular embodiments of the present invention to provide a good method for configuring a configurable measuring system of a configurable sputtering system.

It is also an object of particular embodiments of the present invention to provide a good method for applying a multilayer coating in a configurable sputtering system.

It is also an object of particular embodiments of the present invention to provide a method for applying a multilayer coating on a substrate in a configurable sputtering system, in which the tolerances of the layers are more effectively controlled over the whole area of the substrate.

This object is achieved by embodiments of the present invention.

In a first aspect, the present invention provides a cover for a configurable measuring system of a configurable sputtering system, said configurable sputtering system being adapted for sputtering multilayer coatings on a substrate, said configurable sputtering system comprising a plurality of stations and having a plurality of apertures to provide access to a space within the stations; said cover being detachably attachable to the apertures of the stations; said cover comprising a sensor system that allows at least one property of a partial stack of the multilayer coating on the substrate to be determined, said sensor system comprising at least one sensor provided for detecting or measuring a signal that is representative of the at least one property of the partial stack, and comprising at least one first transmission means for transferring or sending the detected signal or the measured property; said at least one sensor being attached to the cover.

It is an advantage of such a cover that it is particularly suitable for use in configurable sputtering systems, for example sputtering systems with at least fifteen stations, adapted for the production of relatively small batches or for the production of a variety of products, where a different coating stack can be applied for each series. The coating stacks can differ, for example, in their composition and/or in terms of the number of layers.

It is an advantage of embodiments of a cover according to the present invention that it contains at least one sensor system, attached to the cover, since in that way the position of the sensor system in the sputtering system can easily be changed and/or moved depending on the changing composition of the multilayer coating; e.g. by merely moving the cover. In practice, this position may therefore change for each new production run.

In modular embodiments of the cover (e.g. covers having a processing unit that is detachably attached to the outside of the cover) the whole cover doesn't even always have to be moved, but it may suffice to move only a portion of it (e.g. the processing unit, and optionally also a source). This offers the advantage that the cover does not need to be removed, so that the vacuum does not have to be broken, so that much time can be gained, while at the same time allowing the measuring system to be reconfigured with only a limited number of processing units. If at least two processing units (e.g. read-out units) are available, e.g. one of lower quality, and one of higher quality, a modular cover further offers the possibility of swapping the measuring accuracy of the one cover with that of the other cover, without moving the cover itself, but only the processing unit (and, possibly, also the source).

With 'Changing composition' is meant, among other things, that the coating stack in different production runs may have a partially or completely different composition, both in terms of the number of layers (e.g. three or six or ten or fourteen or twenty), and of the material of each layer, and of the thickness of each layer.

As used herein, 'cover' shall be taken to also mean a door or a hatch or a member or an easily detachable panel or a lid, but e.g. not a panel that is welded or solidly affixed using another means to the sputtering system. In operation, the cover has at least one surface which is exposed to the atmospheric side and at least one surface that is exposed to the vacuum side.

As used herein, 'easily detachable' shall be taken to mean, e.g., a flange connection, which, for example, can be attached or detached with nuts and bolts or clamps or tensioning systems, although other connections known to the skilled person are also possible. In a sputtering system in which the glass is conveyed horizontally, and wherein the apertures are available on top of the system (e.g. in a typical sputtering system for coating architectural glass), it may be sufficient to simply place the cover on the sputtering system without additional anchoring. Gravitation provides an initial seal, and further sealing is automatically obtained as soon as the sputtering system is placed under vacuum. It must be possible to seal the connection in an airtight manner, e.g. using O-rings and the like, as is known to the skilled person.

It is an advantage of attaching the at least one sensor system to a movable cover that fits onto existing apertures of existing sputter systems, because this type of cover can immediately be used in existing systems without said systems having to be modified.

It is an advantage of a cover with a sensor system according to embodiments of the present invention that the operator of the configurable sputtering system can henceforth choose to, on the aperture of each station, provide either a cover with a sputtering target, or a cover with a pump unit, or a cover with a sensor unit, or, according to certain embodiments, a cover having a sensor unit and a pump system, or a cover having a sensor unit and a sputtering unit, or a cover having a sensor unit and a pump unit and a sputtering unit. In this way, it is determined whether the section in question will become a sputtering section, or a pump section, or a measuring section, or a combination section of a pump unit with a sensor system, etc. In this way, the flexibility of configurable sputtering systems is further extended, without having to add additional stations to the sputtering installation.

As the cover is easily detachable and movable from one aperture to another aperture (between two production runs), a suitable, for example, optimal position can be chosen for the cover with the sensor system, as a function of the specific coating stack to be applied, and can then be easily moved to a different position for making a different coating stack. The position of the covers may also be chosen based on multiple successive production runs, in which not all the sensor systems actually need to be used. This latter aspect comes to full advantage when the cover also has a detachable processing unit, because in such a case, not all the covers for each production run need to have a processing unit, because the processing unit can be moved between different production runs.

It is an advantage to locate the sensor system on the cover, instead of at a fixed position in the sputtering system (e.g. on the wall), because in this way it can be easily moved to a different location, and a large amount of sensor systems will not have to be purchased, e.g. one sensor system after each sputtering station, which would usually not always all be used anyway.

It is an advantage to use a number (at least one) of covers with a sensor system according to the present invention in a sputtering system, because this allows in situ measurements to be carried out on only a partial coating stack (e.g. a stack which includes only some, but not all layers). By an appropriate choice of the position of this single cover or of a number of covers (e.g. less than 70%, e.g. less than ½, e.g. less than ⅓, e.g. less than ¼, e.g. less than ⅕ of the number of stations or sputtering zones), the number of covers with a sensor system can be drastically less than the number of sputtering zones, while the characteristics (e.g. layer thicknesses) of the coating stack can still be determined with sufficient accuracy, at a reduced investment cost.

It is an advantage of such a cover that it allows one to easily configure or reconfigure the sputtering system, because, depending on the specific stack of layers to be produced, the cover with the sensor system (or several of such covers) can be fitted in the most suitable location(s), e.g. downstream from a/the sputtering zone(s) which is/are the most sensitive for certain properties of the final product (e.g. colour). At the same time, use of such a sensor system can significantly increase the quality of the product, because measurements can be taken at one or more additional locations, so that the system can be adjusted appropriately, without increasing the cost of the installation proportionately, because this cover with the sensor is easily movable to a different location of the sputtering system, which, moreover, can be optimally selected depending on the stack to be produced, and/or the number of available covers with such a sensor system.

Such a cover is ideally suited for the production of glass with a so-called 'low-E stack', which, at the request of the customer, e.g., can be one of three variants: a 'SLE' coating with typically six layers, including one silver layer, a 'IDLE' coating with typically ten layers, including two silver layers, or a 'TLE' coating with typically fourteen layers, including three silver layers.

Furthermore, the sputtering system, comprising sputter targets that contribute to the making of a sputtered layer that is very sensitive to be controlled, may comprise planar or rotatable magnetron sources as known from the art. It is known that within a low-E stack a silver layer and a dielectric layer may have a significant contribution to a sensitive property of the end product (e.g. the reflection color of the layer stack). In a typical large area architectural glass coating configuration the silver layer is being deposited from a planar target and magnetron, while a dielectric layer is being deposited from a cylindrical target and rotatable magnetron.

In general, some layers (e.g. the dielectric layer) are more impactful on being able to achieve the desired properties of the stack. It is therefore an advantage of embodiments of the present invention that it is possible to control certain specific layers versus others. This may be achieved by the movable cover which permits that a sensor system can be moved and/or changed.

It is an advantage of the present invention because it allows the quality of multilayered coatings to be drastically improved, in an economically responsible manner, in particular in installations with relatively small production runs, or which regularly change coating products.

A cover according to embodiments of the present invention is advantageous, because it contains one of the components (in addition to e.g. a software component), which allows the complete coating stack to be analysed in terms of characteristics, e.g., in terms of layer thicknesses. While it is still somehow possible with a six-layer low-E stack (within rough margins) to determine the thickness of each layer solely on the basis of ex situ optical measurements without in situ measurement data, it is practically no longer possible to achieve this with a ten-layer or fourteen-layer low-E coating stack with sufficient precision and reliability. This also applies to other multilayer coating stacks. If each layer thickness is known, each corresponding sputtering target can be adjusted individually to achieve or approach the envisioned thickness.

It is a further advantage of such a cover comprising a sensor that is located closer to more critical deposition zones. If the user is depending solely on the state-of-the-art ex-situ system at the end of the coating line, he does not only lose accuracy of reversely engineering layers that are being deposited at the start of the production line (which can be much better controlled with the proposed invention only having to evaluate a limited number of layers), he may struggle with a significant delay time. In a large sputter coating system for architectural glass having many sputter stations and for instance a relatively low substrate speed with the intention for accurately controlling a triple silver low-E stack to be deposited; a glass pane may be resident in the sputter system for many minutes, even tens of minutes before the whole stack is deposited. If a sudden deviation occurs at the beginning of the line, it may take a while before it is detected by the ex-situ system. Furthermore, providing a feedback signal needing a few iterations before the exact desired setting is achieved, may take a multitude of these many minutes before correction is established. In addition, accurate visibility on one of the initial layers may prove to be complex with the existing software solutions on a multilayer stack. With the proposed invention, a cover having a configurable measurement system may be positioned quite early in the multilayer production line; e.g. after the first critical or sensitive layer. Whenever a deviation occurs in one of the initial layers, the sensor, which is positioned early in the multilayer production line, will be able to detect this much faster and with much higher accuracy. As such, correction and return to high quality high yield product may be secured.

Whereas current configurable sputtering stations only measure the end product, the cover according to the present invention also allows the performance of interim (in situ) measurements on a partially applied stack. The measurement data from the sensor system of the cover, or a plurality of such covers, as well as possibly also the measurement data from an ex situ sensor system may be entered into a software package such as e.g. BREW or OptiRE, and on the basis of all this data e.g. the most probable thickness of each layer can be determined. If only the ex situ measurement data were to be available at the end of the line, it would not be possible to determine the thickness of each layer with sufficient accuracy. By adding extra measurement results obtained from one or more in situ measurement systems, the margin of error can be drastically reduced, thereby approaching the predetermined characteristics of the complete coating more closely.

In an embodiment, the cover further comprises: a source placed at an inner side of the cover, the source being adapted for generating a source signal having a predetermined characteristic.

The source may be, for example, an optical radiation source, or another electromagnetic radiation source, or excitation source. The source may be internally present (at the bottom of the cover, on the inside of the station) for a direct exposure of the source to the substrate.

In an alternative embodiment, the cover further comprises: a source placed at an outer side of the cover, the source being adapted for generating a source signal having a predetermined characteristic, and a second transmission means connectable to the source, the second transmission means being adapted for transmitting or sending a signal originating from the source to the substrate.

Alternatively, the source may be installed on the outside of the cover, and the signal may be transferred from the source to the substrate by means of a transmission means (e.g. an optical conductor, or a fibre optic or electric wire).

In an alternative embodiment, the cover further comprises: a second transmission means connectable to an external source, the second transmission means being adapted for transmitting or sending a signal originating from the source to the substrate.

It is an advantage of such a cover that it is modular with respect to the source. This offers the advantage that the source (e.g. a high quality light source) is interchangeable between different covers, without the cover itself having to be detached. The source may be purchased separately from the cover.

In an embodiment, the sensor system comprises an optical sensor, provided for measuring or transmitting an optical signal originating from the partial coating stack.

In a preferred embodiment, the sensor system comprises, among other things, a radiation source, e.g. a light source that emits an electromagnetic signal with a spectrum in the range from e.g. 300 to 2000 nm, and a sensor or detector provided to measure at least an electromagnetic signal with wavelengths in the range from e.g. 300 to 2000 nm. It is an advantage that a property can be measured over a relatively broad wavelength range (e.g. at least 300 nm broad), rather than one or more discrete frequencies, because this allows to determine the actual layer thicknesses with a higher degree of accuracy than would be possible with only monochrome signals, e.g. by means of curve fitting.

It is an advantage of embodiments of the present invention that such a sensor system (that can measure both at least a portion of the visible spectrum—preferably the entire visible spectrum—as well as a portion of the infrared spectrum) is highly suited for measuring a property of a so-called low-E coating on a glass substrate, e.g. a low-E coating selected from the group consisting of: a low-E coating having a single silver layer (SLE), a low-E coating having two silver layers (DLE), and a low-E coating having three silver layers (TLE).

However, the invention is not limited solely to optical measurements, and other measurements such as e.g. electrical measurements (e.g. a measurement for determining of an electrical resistance between two points), e.g. magnetic measurements or e.g. mechanical measurements, or combinations thereof, such as thermo-optical measurements, or other types of measurements are also possible.

In an embodiment, the sensor system is adapted for measuring an optical transmission signal.

It is an advantage of a sensor system that needs to carry out only transmission measurements that it is relatively easy to mount on a cover, and that small deviations in the mounting have hardly any influence on the result of the measurement, as opposed to, for example, reflectance measurements, which are very sensitive to small deviations in position and/or orientation.

It is an advantage of a sensor system that needs to carry out only transmission measurements because the sensor that carries out the normal measurements through the substrate and the partial or complete coating stack can also be used to calibrate, e.g. by directly measuring the signal of the radiation source at a time when there is no object (e.g. substrate) located between the radiation source and the detector.

In an example, a light source is mounted on a first rail, which is introduced into the sputtering zone in an area that is located on one side of the passage (e.g. above it) where the substrate will pass, and a detector may be mounted on a second rail, which is introduced into the sputtering zone in an area located on a second side of the passage (e.g. below it) where the substrate will pass, or vice versa. In general, the substrate is between the light source and the detector.

In an embodiment, that at least one sensor has a fixed position relative to the cover.

It is an advantage of such a cover that the sensor can be easily mounted by a fixed connection (e.g. screws), and that there are no moving parts, so the risk of mechanical failure, and/or the risk of positioning errors, is minimal. Another advantage of such a cover is that the source may be fixedly mounted, since measurements are only carried out at one position. In a simple example with an optical sensor system, such a cover comprises e.g. one single radiation source and one single detector.

In an alternative embodiment, the cover further comprises at least one rail, and the at least one sensor is movable along the rail.

This offers the advantage that a property (e.g. an optical transmission property, or e.g. an optical reflection property) of the substrate with the partial coating can be determined for a plurality of positions across the width of the substrate, without the cost of a large number of sensors (e.g. light sources and detectors). This in turn offers the advantage that not only the average thickness, but also an 1D or 2D thickness profile of the partial coating stack can be determined, which in some embodiments can be used for local adjustments to the sputtering target. The cover may e.g. include one elongated light source, or multiple light sources, according to the desired measuring positions.

In an embodiment, the cover further comprises at least one rail, and the sensor system comprises a plurality of sensors, located throughout the rail.

Alternatively, the cover may comprise one elongated or multiple discrete light sources, and comprise multiple discrete detectors, all with a fixed position with respect to the rail and with respect to the cover. By attaching the sensors to a rail it is easier to position them on a line.

A cover with such a sensor system is ideally suited to determine the uniformity of a specific property of the coating over the width of a substrate. It is particularly advantageous to place a cover with such a sensor system downstream from a sputtering station with controllable magnets, because it allows the magnets to be adjusted based on the measured values, so as to improve the uniformity in the lateral direction.

It is an advantage of such a cover that it can be used to make the uniformity of the deposited layer less sensitive or insensitive to non-uniformity of the erosion of the sputtering target. This is particularly advantageous for sputtering targets with dimensions greater than, e.g. 1 m, or greater than 2 m, e.g. greater than 3 m, and, in particular, cylindrical sputtering targets. The sputtering targets, however, not need to be cylindrical. Also planar sputter targets are possible. These targets may for example have at least one adjustable magnet that can be regulated locally and or remotely. This may be done while sputtering or in between two sputtering processes. In an embodiment, the cover further comprises a pump unit.

It is an advantage of such a cover that it can provide two functions, namely, both measuring and pumping, but only occupies a single position in the sputtering system, whereby no extra compartments (stations) are required to add the additional functionality of in situ measurements to existing installations and configurations. Such a cover thus allows an existing compartment or section to be configured as a sputtering section (as in the past), or a pump section (as in the past), or a measurement section (as mentioned above), or both a measuring and pump section. As a result, the flexibility of the configurable sputtering system is retained (existing pumping stations can retain this functionality, but the functionality is increased (this station can now also be used to carry out an in situ measurement), with minimal impact to the existing infrastructure and components, and configurations of known coating stacks. This advantage should not be underestimated.

In an embodiment, the cover further comprises a sputtering unit.

It is an advantage of this cover that the functionality can be added since this station can now no longer only sputter, but also perform an in situ measurement thanks to this cover. In this case, however, the necessary measures should be taken (e.g. sufficient distance between the sputtering targets and the sensor system, and/or suitable screening of the sensor system) to prevent the sensor system from becoming soiled too quickly.

In a second aspect, the present invention provides a configurable measuring system for use in a configurable sputtering system for measuring a partial stack of a multilayer coating, comprising: at least one cover according to the first aspect; a signal processing unit for processing at least one signal originating from the at least one sensor of the sensor system of the at least one cover.

The signal processing unit may be, e.g., a photo spectrometer, whether or not preceded by an optical multiplexer. The signal processing unit may be adapted for analysing the signal or processing it in another way, in order to extract a property or characteristic of the partial or complete coating stack from the signal. The signal processing may be carried out in the optical domain, or electrical, analogue or digital, or combinations thereof. In a specific example, the signal processing unit may be adapted for determining the transmission coefficient across a predetermined spectrum range for wavelengths from e.g. 350 to 1000 nm.

Such a measuring system has the advantage with respect to existing measuring systems that it can be applied, and is even especially suited in configurable and/or reconfigurable sputtering systems. Thanks to such a measuring system, a property, e.g. the thickness of each layer of a multilayer coating stack, can be determined, or determined with a higher degree of accuracy than was previously possible, and on the basis of deviations with respect to the envisioned layer thicknesses, an operator can e.g. make the necessary adjustments, e.g. by adjusting the power of a particular sputtering target or by adjusting the gas pressure in the sputtering chamber or by adjusting the magnetic field e.g. with an on-line adjustable magnet. Where in embodiments of the present invention reference is made to an on-line adjustable magnet, reference is made to a magnet or magnet configuration of which the magnetic field strength and/or the magnetic field orientation can be modified while sputtering, i.e. without breaking the vacuum.

It is an advantage of such a measuring system that it is not necessary that an in situ measurement be carried out downstream from every sputtering zone, but that a good measurement with accurate results is also possible with a smaller number of in situ sensor systems, by installing/moving covers with sensor system in/to a number of suitable locations, e.g. in the most sensitive areas in terms of the specific coating stack(s) that is/are to be produced, and/or the number of available covers with a sensor system, and/or (especially in the case of modular covers) the number of available covers with a sensor system and the number of available signal processing units. It is an advantage that the sensor system can very easily be adjusted as required, by moving the covers (with sensor system), and/or, in the case of modular covers, moving the processing units and/or the sources.

The processing unit (e.g. spectrophotometer) may have a modified sensitivity level or measuring range according to the required measuring accuracy at that particular location for that specific partial stack of the multilayer coating.

It is an advantage that such a configurable measuring system can be very conveniently used in combination with a computer system provided with software for determining the thickness of every layer of a partial coating stack. A basic version of such software is commercially available, e.g. under the name 'BREIN' or 'OptiLayer'.

In an embodiment of the configurable measuring system, the signal processing unit is detachably attached to the outside of the cover, such that the signal processing unit is interchangeable between covers without having to disassemble the cover.

This has as an advantage that the number of covers (without signal processing unit) may be larger than the number of signal processing units, and that the position of the covers can be optimised across multiple production runs of different coating stacks, while the position of the signal processing units can be optimised for each individual production run. After all, this allows a cover to be provided at a location that is not being measured in the current production run, and therefore requires no signal processing unit, but where measurements will be done in a subsequent production run. Because the signal processing unit is interchangeable, the covers do not need to be changed, but only the signal processing unit, so that the vacuum does not need to be broken between successive production runs. In this way, the efficiency of such a sputtering installation can be further improved, as well as the quality of the product.

In an embodiment, the configurable measuring system further comprises the source, detachably mounted on the outside of the cover and detachably connected to the second transmission means.

Such a measuring system has as an advantage that not only the processing system, but also the source, is interchangeable between covers. This is especially useful when a certain source and processing unit are matched to each other, e.g., a normal quality source belongs to a normal quality signal processing, while a high quality source belongs to a high quality signal processing. In this way, a particularly flexible and modular solution is provided.

In a third aspect, the present invention provides a feedback system for a configurable sputtering device, in which the feedback system comprises: a configurable measuring system according to the second aspect; a computer system provided with software for determining of a property of at least one layer of the multilayer coating on the basis of measurement data from the configurable measuring system.

A basic version of such software is commercially available, e.g. under the name 'BREIN' or 'OptiLayer'.

The computer system is provided with the necessary information from the one or more processing units of the configurable measuring system (e.g., one or more spectral transmission curves), on the basis of which it can determine the thickness of the layers of the partial coating stack.

It is an advantage of embodiments of the feedback system that it can work on the basis of the data from a single cover with its own sensor system and source and processing unit, or from multiple covers, each with its own processing unit, but with its own or interchangeable source, and its own or interchangeable processing unit.

It is an advantage of certain embodiments of the feedback system that for example the thicknesses of the layers or the optical properties of the layers can be calculated for multiple lateral positions. As a result, the feedback system may make the operator aware of certain abnormalities or deviations of the desired set-point performance.

It is an advantage that these thicknesses or optical properties can be shown to an operator, who can make the necessary adjustments to the sputtering installation. Furthermore, the feedback system may propose certain adjustments as to correct the observed deviations. These proposals may be evaluated by the operator and it is up to his decision as to make these adjustments or not. If the operator believes that the proposed adjustments are consistently desired, it may be decided automating these proposals as to realize an autonomously controlled operating system.

Optionally, the feedback system according to the present invention can also make use of the measurement data from the ex situ sensor system. This offers the advantage that the thicknesses of all layers of the complete coating stack can be determined with only one feedback system. Alternatively, these values may also be entered into the system that handles the ex situ measurements. The thicknesses of all the layers can also be determined in this manner.

In an embodiment, the feedback system further comprises: an ex situ sensor system provided for measuring a property of the multilayer coating; wherein the software is further provided for determining a property of at least one layer of the multilayer coating on the basis of data from the configurable measuring system, and on the basis of the data from the ex situ sensor system.

It is an advantage of combining the measurement data from the one or more in situ sensor systems and the ex situ sensor system because in this way the thickness of each layer of the coating stack can be determined with a sufficiently high degree of accuracy, which is not always possible on the basis of ex situ measurement data alone. It is an advantage of such a combined or integrated system that only a single computer system is required, although this is not strictly necessary for the present invention.

In an embodiment, a feedback system is also provided for use in a configurable sputtering system that comprises at least one control mechanism that allows the sputtering process which takes place in the sputtering system to be influenced locally; wherein the computer system and the software are further adapted for providing a control signal for adjusting the sputtering process on the basis of data from the sensor system.

In this system, automatic adjustment occurs on the basis of (at least) the data from at least one sensor, originating from a cover having a sensor system as described above. The adjustment may be a global process parameter such as, e.g., the partial gas pressure of a particular station, or the transport speed of the substrate or a controllable sputtering aperture of a particular station, and/or may be a local process parameter (e.g. the power of one particular sputtering target), and/or may even be a local parameter within one particular sputtering target (e.g., the position of at least one controllable magnet), in order to in this way influence the deposited layer thickness.

The main advantage of this automatic adjustment is to reduce deviations of the produced coating from the predefined specification, thereby reducing the risk that a product will not meet the predefined specification(s).

In an embodiment, a feedback system is also provided for use in a configurable sputtering system which comprises at least one (e.g. cylindrical) sputtering target having at least two on-line adjustable magnets; and wherein the sensor system is adapted for measuring a property of the layer applied by said (e.g. cylindrical) sputtering target to at least two different lateral positions on the substrate; and wherein the computer system and the software are further adapted for providing at least one control signal for the online adjusting of the online adjustable magnets on the basis of data coming from the sensor system.

Such sputtering targets per se have already been described in WO2013120920A1, but not in combination with a control system, let alone with an in situ sensor system mounted on a cover as described above. Nevertheless, such a sputtering target is ideally suited for application in a configurable measuring system as described above. Indeed, if a deviation is identified in a property (e.g. the layer thickness) at different transverse positions of the substrate, then this deviation can not only be detected but also be corrected by a corrective online adjustment of the adjustable magnets.

Such a measuring system thus contains a cover with a sensor system that is mounted downstream relative to said (e.g. cylindrical) sputtering target with on-line adjustable magnets, that is, the sensor system is located past the position of said sputtering target, in the direction in which the substrate is moving through the sputtering installation.

The sensor system may e.g. include at least two light sources and at least two detectors, or can e.g. include at least one movable light source and two detectors, or e.g. at least two light sources and at least one movable detector, or at least one movable light source and at least one movable detector; however, multiple light sources and/or multiple detectors may also be used.

It may also be advantageous that the measuring positions (i.e., the positions of the detectors with respect to the cover) are coordinated with the positions of the adjustable magnets, because this can simplify the calculations for the necessary adjustment of the magnets, although this is not strictly necessary for the present invention. Alternatively, e.g. interpolation techniques or extrapolation techniques may be used for adjusting the on-line adjustable magnets.

Of course, the sputtering installation may also include multiple (e.g. cylindrical) sputtering targets with on-line adjustable magnets, and it is sometimes possible (e.g. when the respective layers are not too far apart), to use one and the same sensor system to adjust the adjustable magnets of more than one sputtering target. Alternatively, a corresponding cover with sensor system can be provided for each sputtering target with on-line adjustable magnets, for the optimal adjustment of the on-line adjustable magnets. The number of on-line adjustable magnets of the sputtering targets can, of course, be different for different sputtering targets.

Adjusting the on-line adjustable magnets can, e.g., be adjusting a current for generating a magnetic field, or it can e.g. be controlling an actuator that determines the position of a permanent magnet, or it can be a different form of control.

Ideally, all sputtering targets include on-line adjustable magnets, but this is relatively expensive, and is also not strictly necessary, and the operator can make a suitable decision about which sputtering targets should and which sputtering targets shouldn't have on-line adjustable magnets. The software should be informed of the capabilities of each target. Such software is (as far as known to the inventors) not known in the prior art, at least not in combination with the functionality described above. This is another example of the high degree of flexibility offered by the present invention: depending on the capabilities of the elements, e.g. the number of covers with sensor system for in situ measurements, the number of targets with on-line adjustable magnets, etc., an optimal configuration can be chosen, which, e.g., comprises an optimal position for placement of the covers-with-sensor system, and the sputtering targets with on-line adjustable magnets, such that a good, e.g. optimal, result is obtained in an economically sound manner.

In an embodiment of the feedback system the computer system and the software are further adapted for providing a control signal for automatically adjusting at least one of the sputtering parameters chosen from the group consisting of: power of a (e.g. cylindrical) sputtering target, spatially distributed partial gas pressure in the sputtering system, position of on-line adjustable magnets of at least one sputtering target, position and aperture of the shields.

It is an advantage of such a sputtering system that the adjustments are done automatically, e.g. by means of one or a plurality of actuators, and with or without the supervision of the operator, because automatic control minimises the risk of errors, but above all because it allows complex and dynamic controls, taking into account, e.g. amplification factors of control units, and, optionally, taking into account deviations of other layers (e.g. underlying layers).

In a fourth aspect, the present invention provides a method for configuring a configurable measuring system according to the second aspect or a feedback system according to the third aspect, wherein the method comprises the steps of: providing at least one cover with a sensor system; selecting a suitable position for the cover in the sputtering device as a function of the envisioned composition of at least one multilayer coating; detachably attaching the cover to an aperture at the chosen suitable position.

In an embodiment, the method comprises the steps of: providing at least two covers with a sensor system; providing at least one signal processing unit; selecting a suitable position for the at least two covers in the sputtering devices, as a function of the predefined composition of at least two multilayer coatings to be produced; detachably attaching the cover to the apertures of the selected suitable positions; selecting a suitable position for the at least one signal processing unit on one of the at least two covers, as a function of the multilayer coatings to be produced; detachably attaching the at least one signal processing unit to the selected cover.

It is an advantage of such a method that, after the first production run has been terminated for the first multilayer coating, the at least two covers can remain at their respective locations, and only the signal processing unit M2 needs to be moved, without having to break the vacuum. In this way, the process time, in particular, the time needed to reconfigure the sputtering device, can be reduced, and the efficiency increased.

In a fifth aspect, the present invention comprises a configurable sputtering system for sputtering multilayer coatings with a varying composition on a substrate; the configurable sputtering system comprising a plurality of stations, and having a plurality of apertures to provide access to a space within the stations; and further comprising a configurable measuring system according to the second aspect, or a feedback system according to the third aspect.

This sputtering system with at least one movable cover on which is mounted an in situ sensor system offers the advantage compared to existing configurable sputtering systems without an in situ sensor system that it allows measurements to be taken during production (in real-time), to determine the most likely actual thickness of each layer, and to adjust parameters of the process. In this way, the quality of the obtained product can be increased, a coating can be obtained with smaller deviations from the predefined specifications, and the number of products which do not comply with the specification can be drastically reduced.

The system even allows certain deviations in a previously deposited layer to be compensated at least partially through an intentional deviation of at least one layer to be deposited later with respect to the envisioned layer thickness, in order to optimise the properties of the complete coating stack. For example, if the thickness of a first silver layer would be 3% less than planned, the power of the sputtering target that is to apply the second silver layer may be temporarily increased when the same substrate passes by this sputtering target, so as to keep the total thickness of the silver layers constant. Of course, this is just one particular example.

In a sixth aspect, the present invention provides a method of applying a multilayer coating on a substrate, the method comprising the steps of: configuring a configurable measuring system or a configurable feedback system according to the fourth aspect; calibrating the configurable measuring system; measuring a property of a partial coating stack applied to the substrate using the configurable measuring system; calculating a deviation of the measured property with respect to an envisioned property of the partial coating stack; adjusting at least one parameter of the sputtering system based on the calculated deviation.

It is an advantage of the step of calibrating that any deviation of the sensor signal as a result of the movement of the cover can be detected and corrected in this way before a new batch of substrates is started.

The method may include the step of determining the layer thickness of at least one, e.g. all, layer(s) of the multilayer coating, based on the measured property.

The adjustment can be done manually or automatically.

In an embodiment, the method further comprises the step of calibrating the measuring system during production.

It is an advantage of the (e.g. repeated) calibration of the measurement signal during production, e.g. each time an opening between two successive substrates passes by the sensor system, because in this way any deviation due to e.g. drift or temperature or pressure change, or contamination, etc., can be detected and/or corrected. In an embodiment of the method, the sputtering system comprises at least one (e.g. cylindrical) sputtering target having a plurality of on-line adjustable magnets, and the method further comprises a step: for measuring a property at multiple locations over substantially the entire width of the substrate, and for proposing an adjustment to correct the deviation or for automatically adjusting the on-line adjustable magnets in order to minimise deviation of the deposited coating stack with respect to the envisioned coating stack.

It is an advantage of this method that it allows deviations of a particular layer thickness on a substrate to be determined, and the sputtering target which caused said deviations to be adjusted so that these deviations are reduced in future substrates, but without adjusting other sputtering targets to compensate for the existing deviation of the corresponding layer on the substrate that was measured. This prevents the same deviation from occurring again in the future for other substrates. This offers the advantage that the complexity of this system is limited, and that corrections can be carried out without taking into account properties of other layers.

In an embodiment of the method, the sputtering system comprises at least one (e.g. cylindrical) sputtering target having a plurality of on-line adjustable magnets, and the method comprises a step: of measuring or determining a property of a partial coating stack on a substrate, deposited in a first sputtering zone of the sputtering system; and for calculating a deviation of the measured or determined property with respect to envisioned properties; and automatically adjusting the on-line adjustable magnets of a (cylindrical) sputtering target in a second sputtering zone, at a time when said substrate enters the second sputtering zone, wherein the automatic adjustment is such that the calculated deviation of the partial coating stack is at least partially compensated by the layer which is to be applied in the second sputtering zone with the adjusted online-adjusted magnets.

It is an advantage of this embodiment that deviations which occurred in an earlier stage of the sputtering system can be at least partially compensated by adjustments of a later stage of the sputtering system (which deposits a same material). This allows the quality of the end product to be guaranteed, despite certain differences in particular individual layers. Furthermore, it may be desirable and even feasible that certain deviations in certain layers may be corrected rather acceptably by applying a regulation mechanism in the sputter process of another layer with a different composition. It may be clear that the adjustment in this case causes a deliberate deviation on the layer being controlled for adjusting a deviation that is taking place at another coating position, possibly with a different layer composition. This compensation may be initiated in order to achieve a desired property of the complete coating stack being measured by the ex situ sensor system at the end of the line. Adjusting a certain layer in order to compensate an error in a different layer may be less or more effective depending on the specific layers.

In a sixth aspect, the present invention provides a computer program product for, when it is executed on a computer system of a feedback system according to the third aspect, carrying out a method according to the fifth aspect, as well as a machine-readable data storage medium comprising such a computer program product, as well as a method of sending such a computer program product over a local or wide area network (WAN) telecommunications network.

BRIEF DESCRIPTION OF THE DRAWINGS

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

FIG. 1 illustrates some aspects of a so-called 'low-E stack' as an example of a multilayer coating stack on glass, known in the prior art.

Figure 1A:
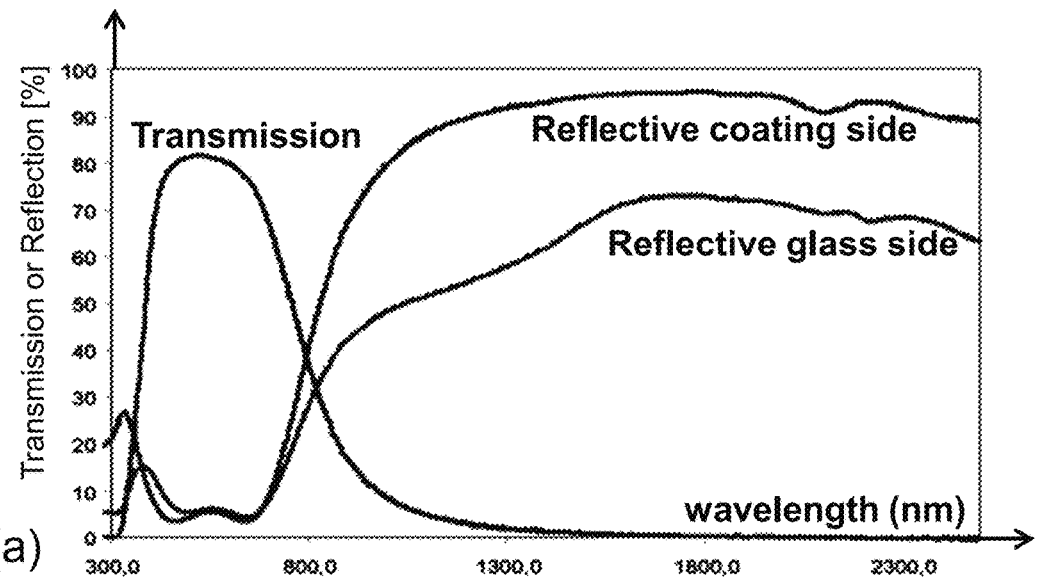

FIG. 1(a) shows a typical transmission or reflection characteristic of a low-E stack having multiple Ag layers from 5 to 20 nm thickness, which is fairly transparent to visible light (e.g. 400-700 nm), and which functions as a mirror for infrared light.

Figure 1B:
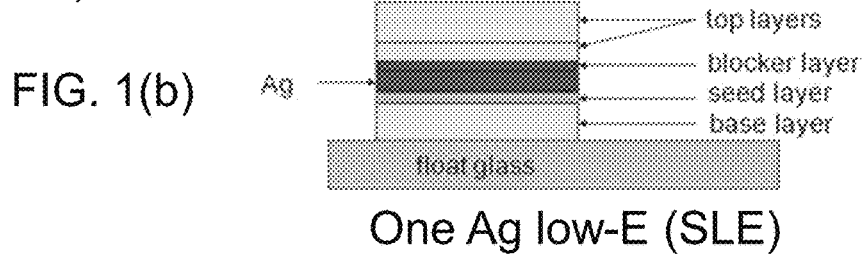
Figure 1C:
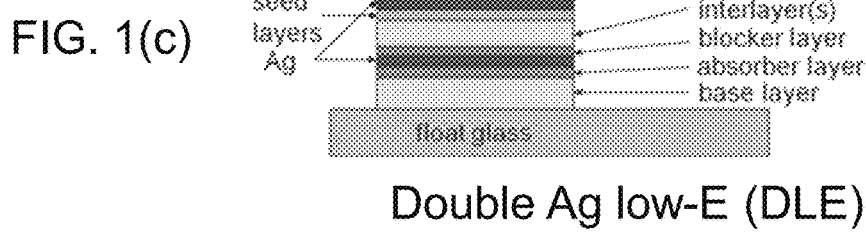
Figure 1D:
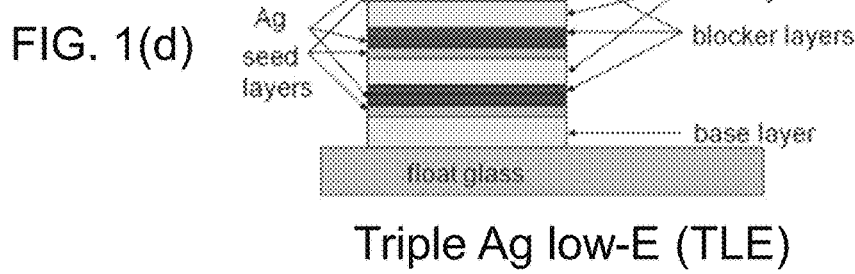
Figure 2:
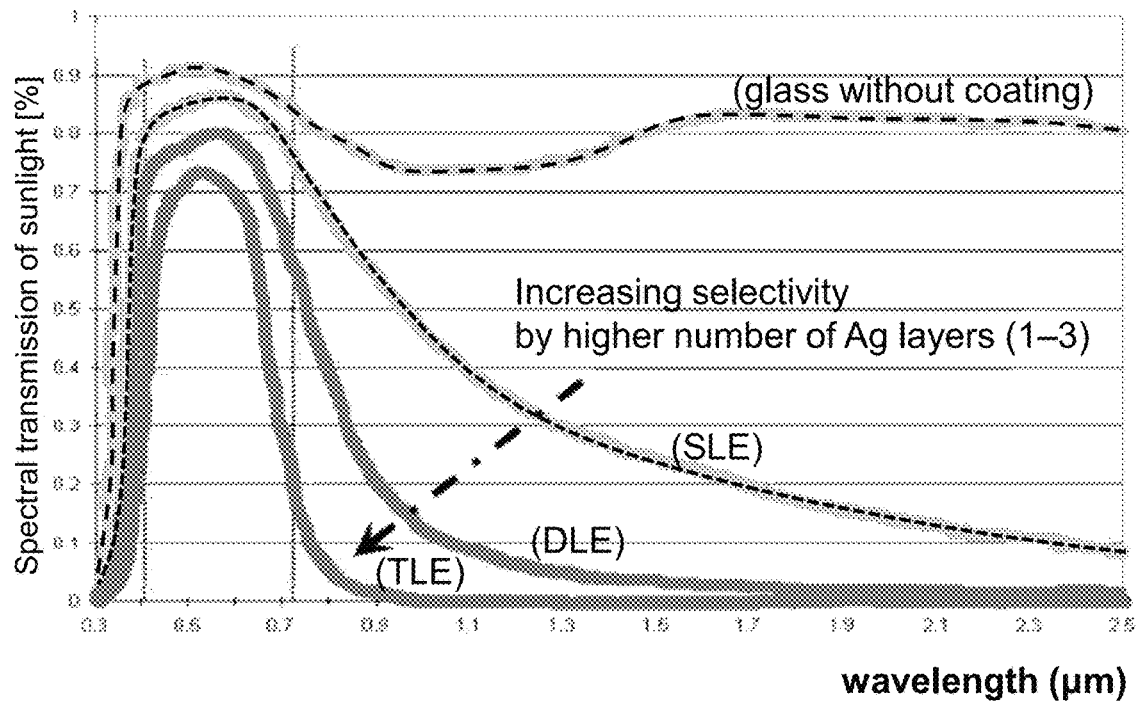

FIG. 1(b) shows an example of a low-E stack having one single layer of silver,

FIG. 1(c) shows an example of a low-E stack having exactly two silver layers,

FIG. 1(d) shows an example of a low-E stack having exactly three silver layers,

FIG. 2 shows the increase in selectivity for a low-E coating stack with one, two or three silver layers, known in the prior art.

Figure 3:
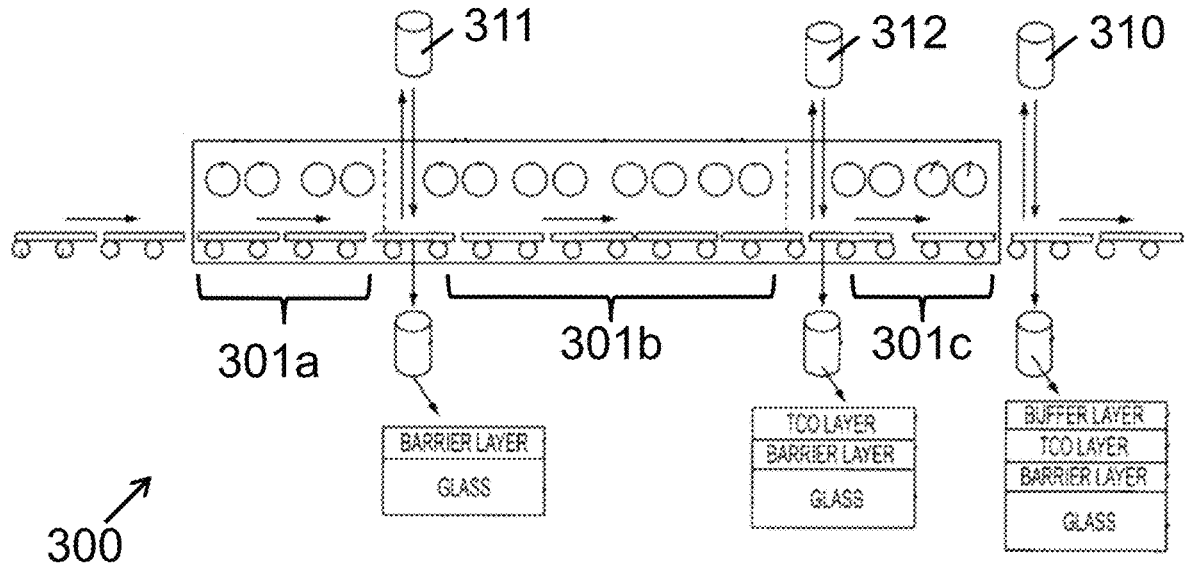

FIG. 3 shows a sputtering system with an ex situ measuring system and two in situ measuring systems known in the prior art.

Figure 4A:
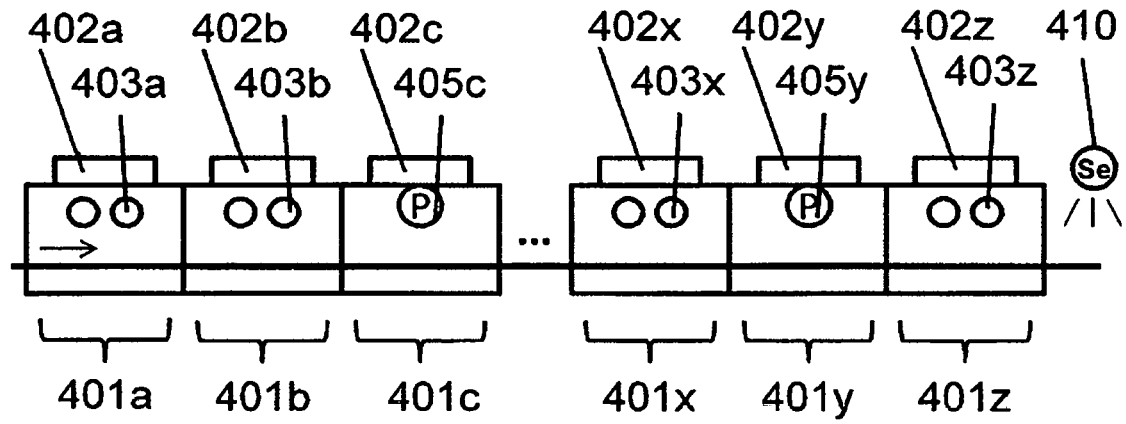

FIG. 4(a) is a schematic representation (e.g. in side view) of a prior art configurable sputtering system for the production of a configurable coating stack, with an ex situ sensor system at the end of the sputtering system.

Figure 4B:
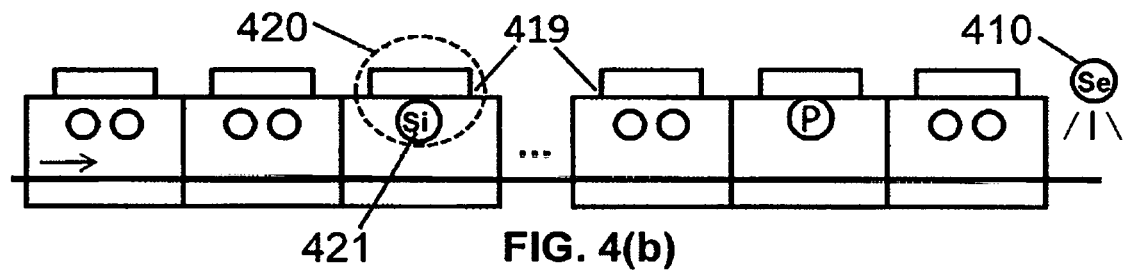

FIG. 4(b) is a schematic representation (e.g. in side view) of a configurable sputtering system according to the present invention with a movable, e.g. removable cover according to the present invention, having attached thereto a sensor system for the in situ measurement of at least one property of a partial coating stack which includes one or more layers of the complete coating stack.

Figure 4C:
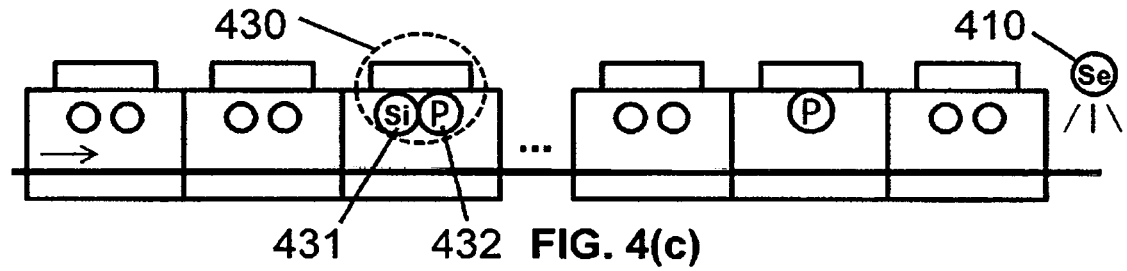

FIG. 4(c) is a schematic representation (e.g. in side view) of a configurable sputtering system according to the present invention with a movable (e.g. removable) cover according to the present invention, having attached thereto both a sensor system for the in situ measurement of at least one property of a partial coating stack which includes one or more layers of the complete coating stack as well as a pump system.

Figure 4D:
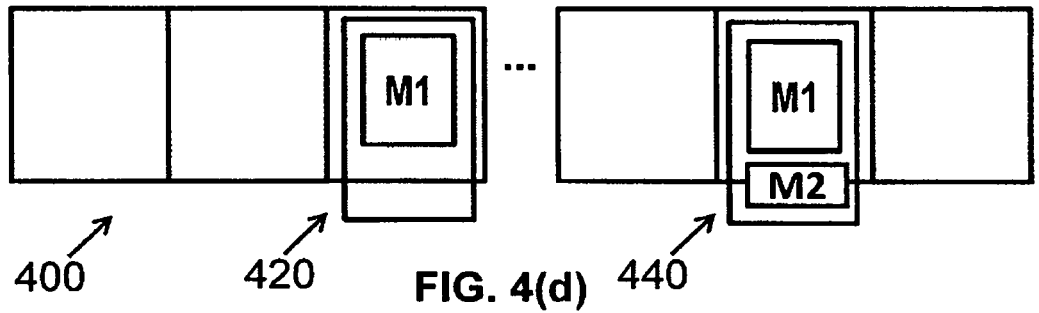

FIG. 4(d) is a schematic representation (e.g. in top view) of a configurable sputtering system according to the present invention with a movable (e.g. removable) cover according to the present invention, having attached thereto an in situ sensor system for the measurement, at multiple lateral positions of the substrate, of at least one property of a partial coating stack.

Figure 5:
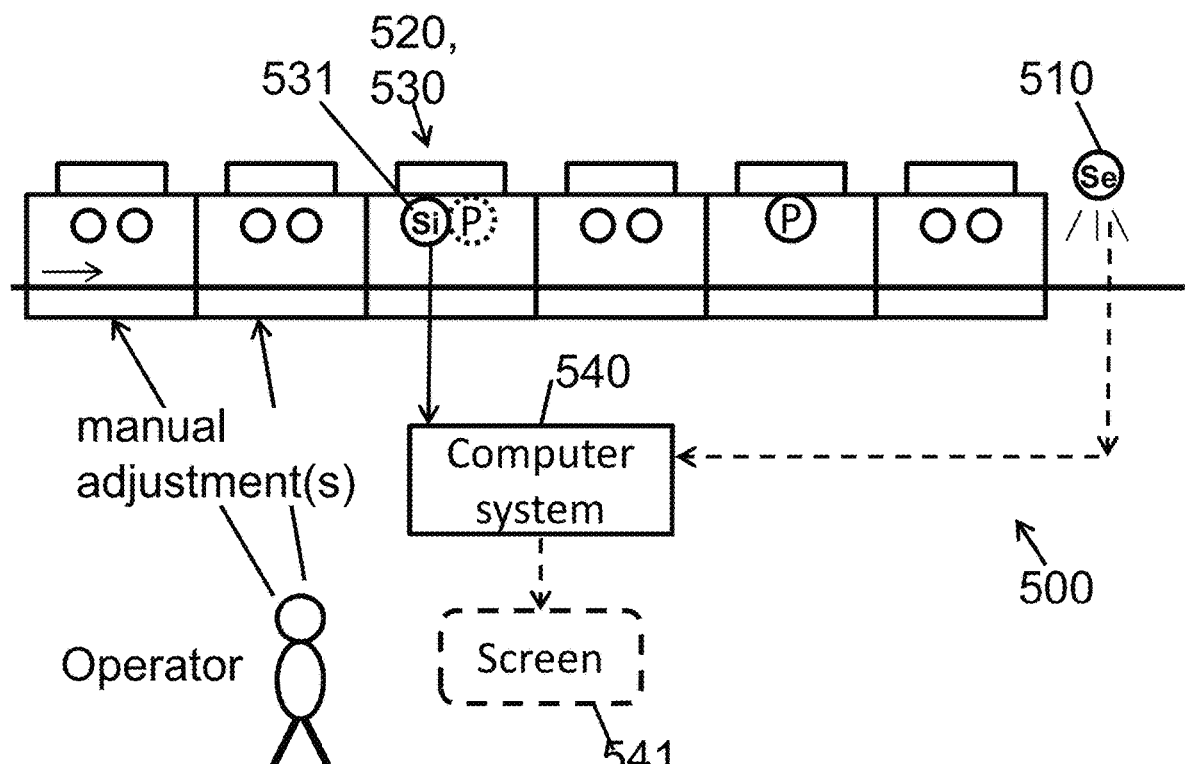

FIG. 5 is a schematic representation of an embodiment of a configurable feedback system according to the present invention. The feedback system comprises a configurable measuring system, as well as a computer system having a software program for calculating the layer thicknesses and/or certain layer properties (e.g. spectral transmission characteristic and/or spectral reflection characteristic) of the partial coating stack. In the example of FIG. 5, at least one result of the calculation or analysis is shown on a screen to an operator, who can perform appropriate manual adjustments based on the information displayed.

Figure 6:
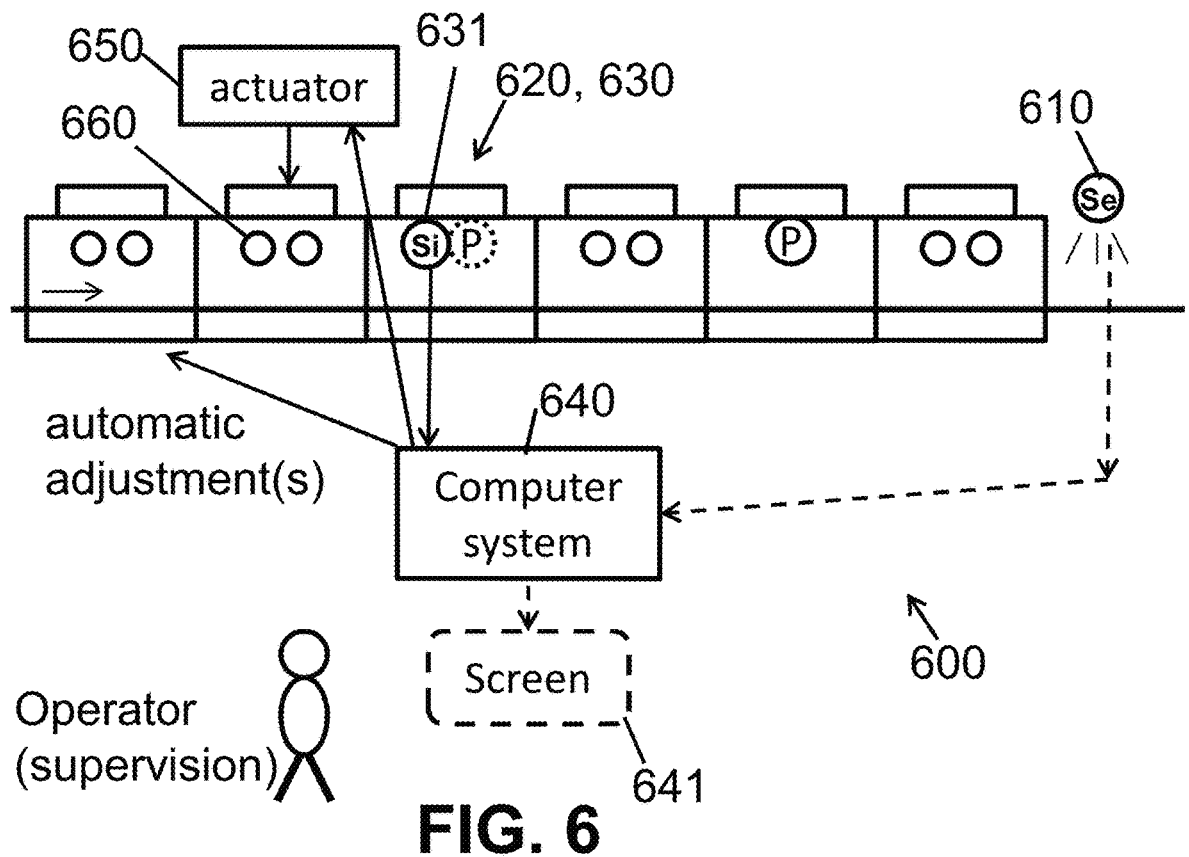

FIG. 6 is a variant of the configurable feedback system of FIG. 5, wherein the computer system automatically controls at least one parameter of the sputtering system, e.g. a global parameter, such as sputtering power, and/or local parameters, such as e.g. the position(s) of one or a plurality of magnets of at least one cylindrical sputtering target having on-line adjustable magnets.

Figure 7:
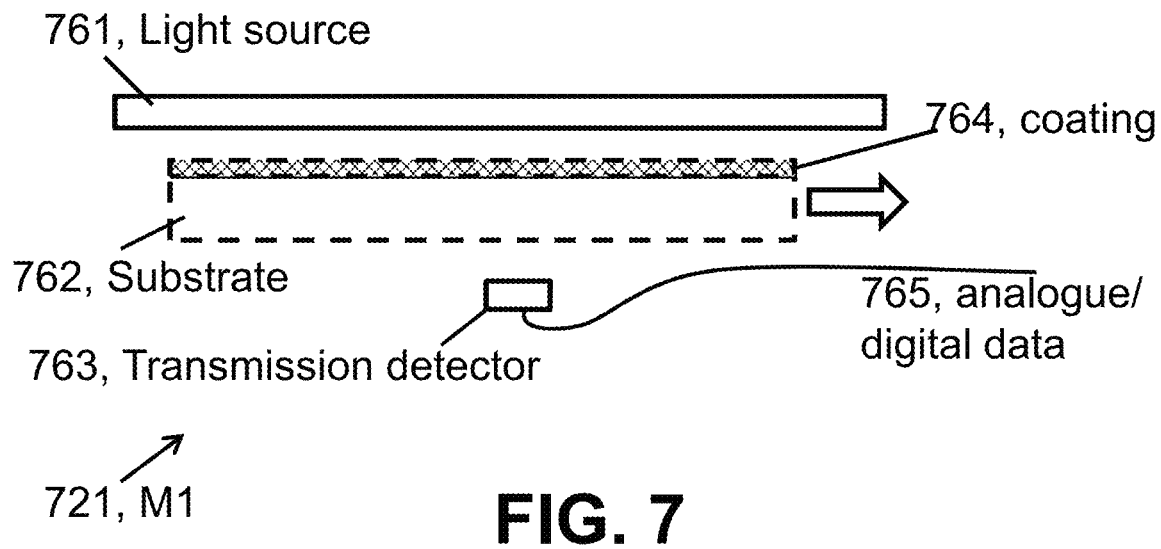

FIG. 7 shows an example of an optical sensor system that can be used in embodiments of a cover according to the present invention, in which the sensor system is adapted to perform an optical transmission measurement through the partially coated substrate.

Figure 8:
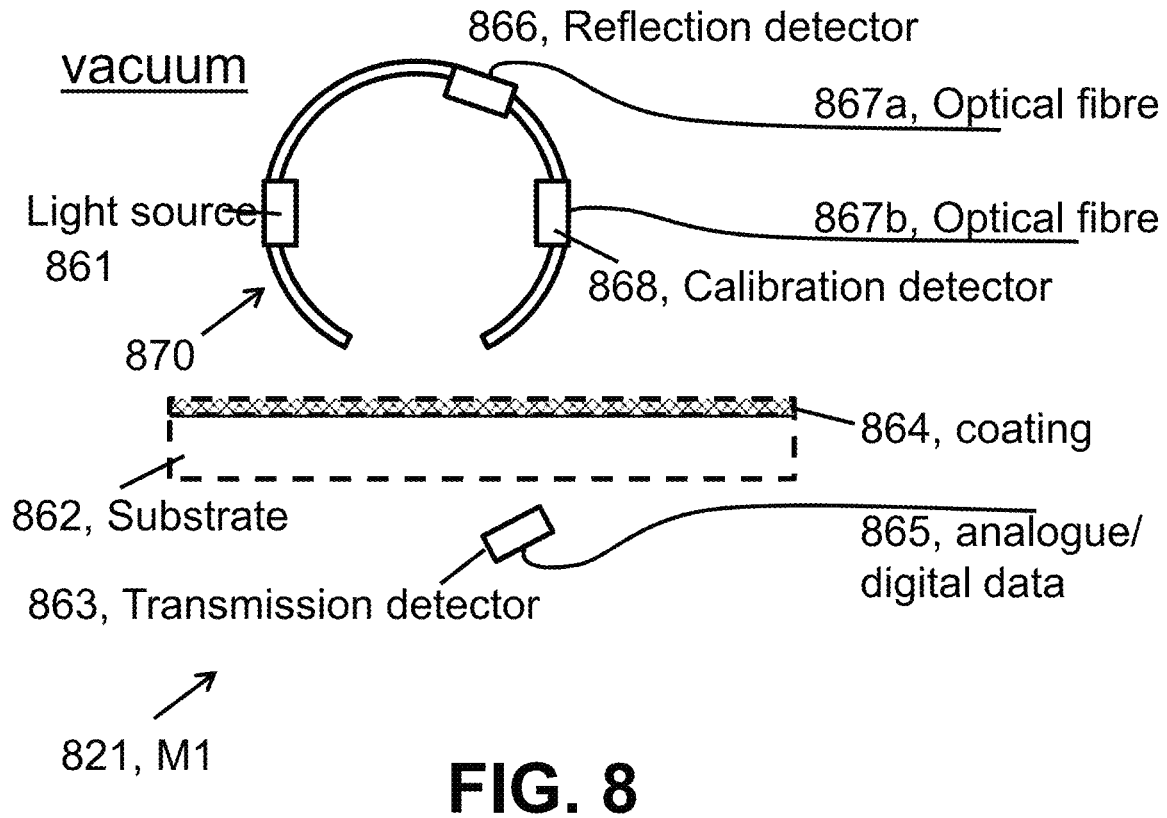

FIG. 8 shows an example of an optical sensor system that can be used in embodiments of a cover according to the present invention, in which the sensor system is adapted for performing an optical reflection measurement.

Figure 9:
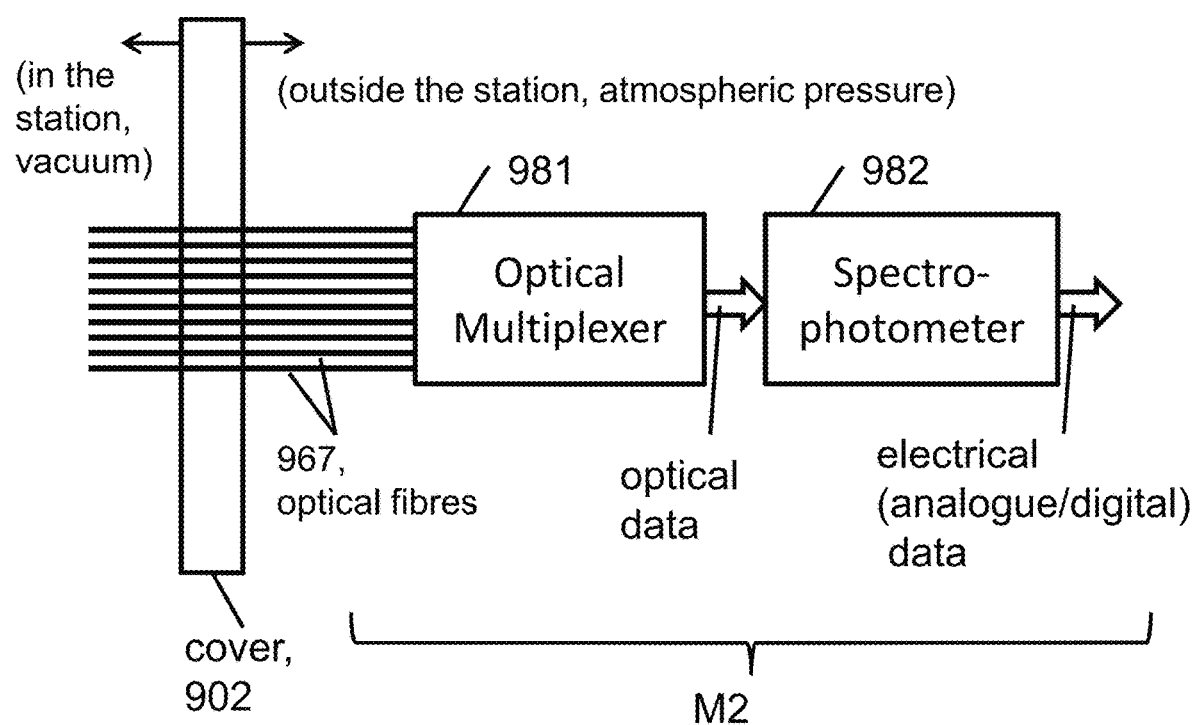

FIG. 9 shows an example of a signal processing unit (which in this example consists of a spectrophotometer and an optical multiplexer), which can be used in embodiments of a configurable measuring system according to the present invention.

Figures 10A, 10B, 10C:
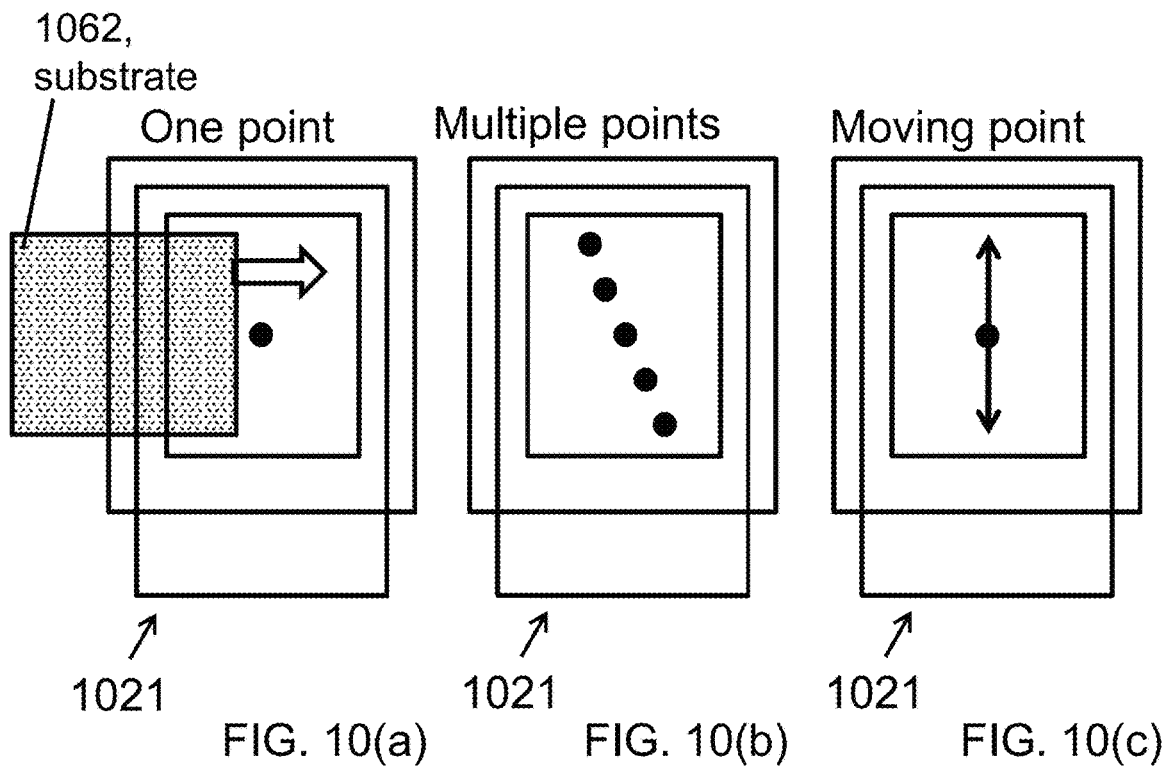

FIGS. 10(a) to 10(c) show some schematic examples of different configurations of sensor systems, such as that may be used in a cover according to the present invention. FIG. 10(a) shows an example of a sensor system with a single sensor (shown schematically by a black dot), which is mounted at a fixed position to the cover. FIG. 10(b) shows an example of a sensor system with five sensors which are mounted at a fixed position to the cover. FIG. 10(c) shows an example of a sensor system with a single sensor which is movable in lateral direction relative to the cover (and thus, during use, also with respect to the substrate).

Figures 11A, 11B:
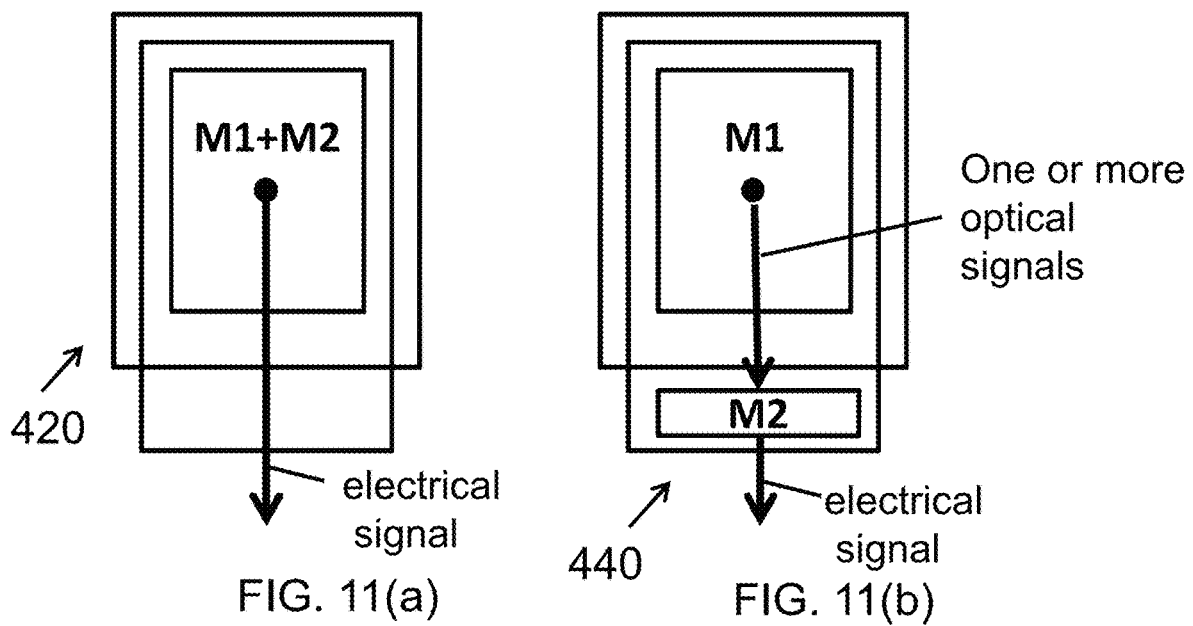

FIG. 11(a) shows an example of a configurable measuring system according to the present invention, the cover comprising a sensor system M1 and a signal processing unit M2, attached to the cover.

FIG. 11(b) shows an example of a configurable measuring system according to the present invention, wherein the cover comprises a sensor system M1 and a signal processing unit M2, wherein the sensor system M1 is fixedly attached to the cover, but wherein the processing unit M2 is detachably attached to the cover, and is therefore interchangeable between a plurality of covers.

Figure 12:
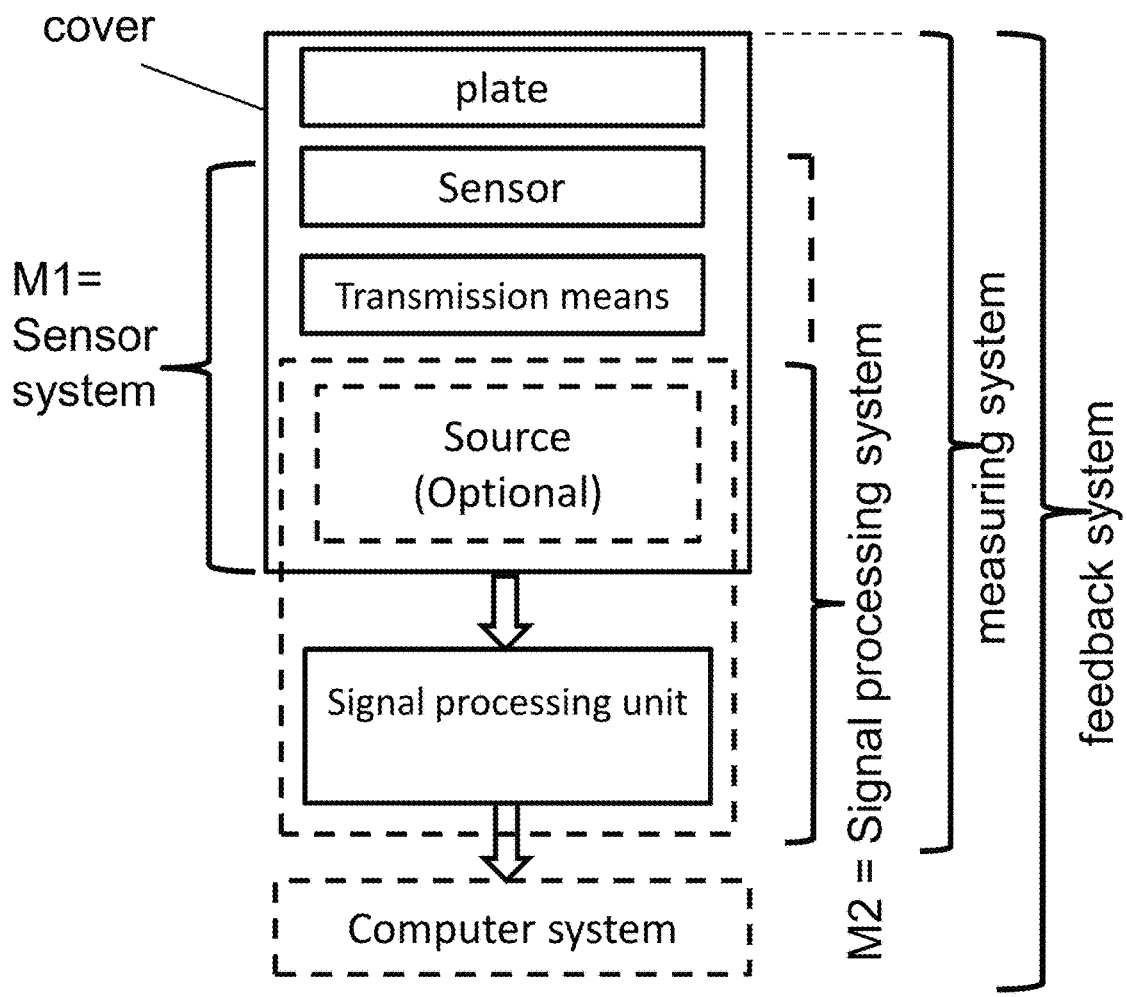

FIG. 12 is a schematic representation of the main terms used in the present invention, and illustrates, inter alia, the terms 'cover', 'sensor system' M1, 'signal processing system' M2, 'measuring system' and 'feedback system', as well as their interdependence.

Figure 13:
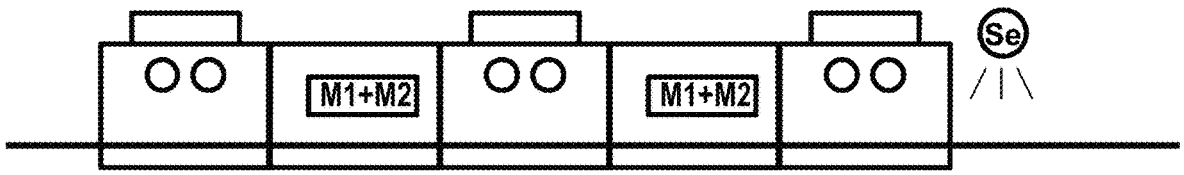

FIG. 13 is a schematic view of the sputtering device of FIG. 3, making use of the symbols M1 and M2 as defined in FIG. 12. In this known sputtering device, both the sensor system M1, and the signal processing system M2, are present within a station, not interchangeable, and not mounted to the cover.

FIG. 14(a) to FIG. 14(d) show some examples of covers having a sensor system, such as may be used in a measuring system and/or in a feedback system and/or in a sputtering system according to the present invention.

Figure 14A:
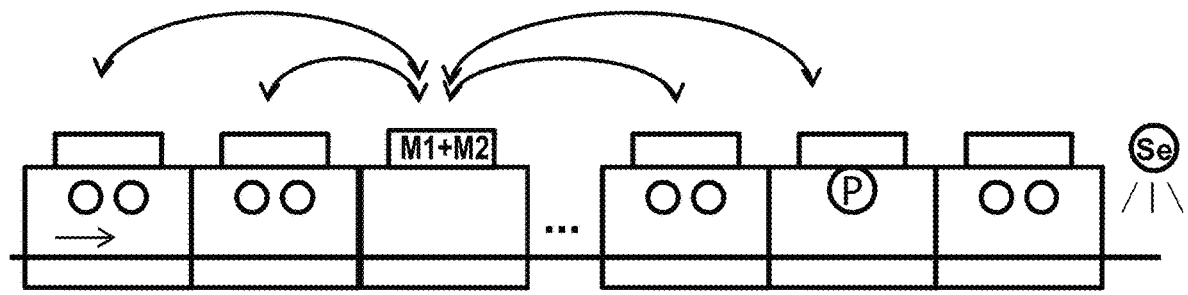

FIG. 14(a) shows (in station 3) a cover having attached thereto a sensor system M1, and a signal processing unit M2.

Figure 14B:
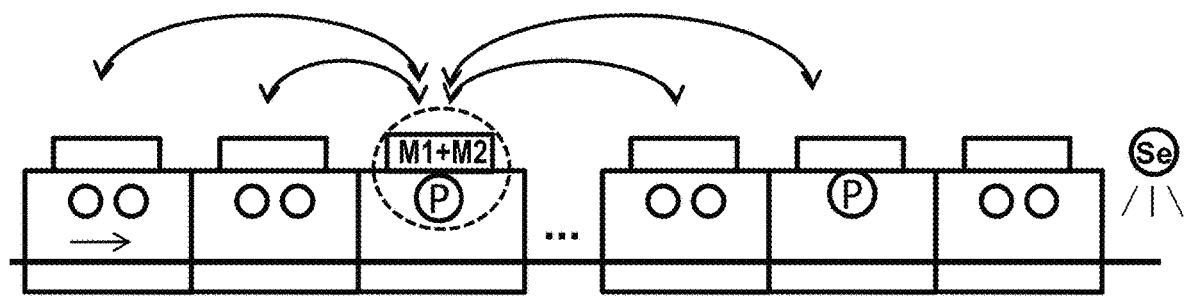

FIG. 14(b) shows (in station 3) a variant of the cover of FIG. 14(a), further comprising also a pump unit P.

Figure 14C:
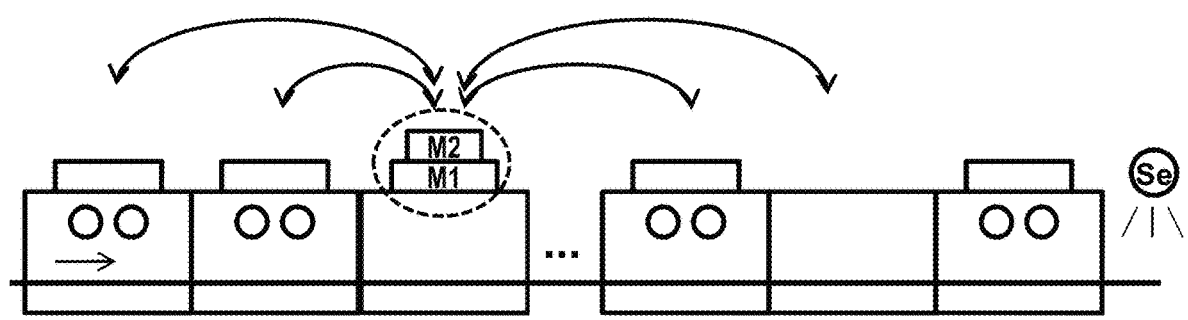

FIG. 14(c) shows a variant of the cover of FIG. 14(a), wherein the signal processing unit M2 is detachably attached to the sensor unit M1, but is detachable, and is interchangeable with other covers.

Figure 14D:
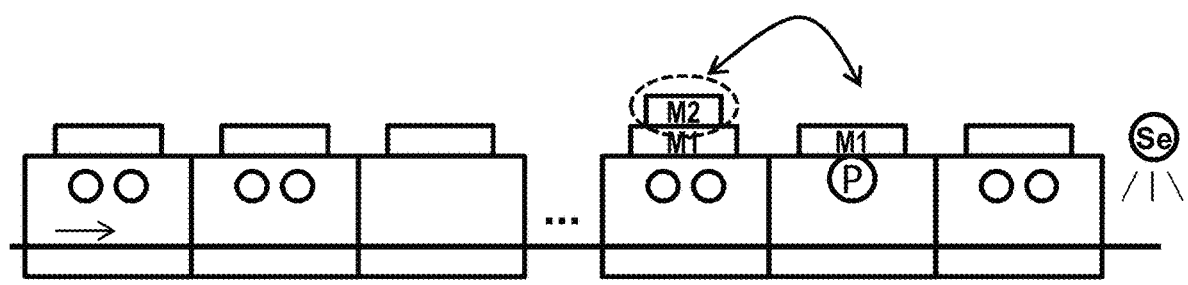

FIG. 14(d) shows an example of a sputtering device with two covers according to FIG. 14(c) and a single signal processing unit M2 that is interchangeable with other covers.

Figure 15:
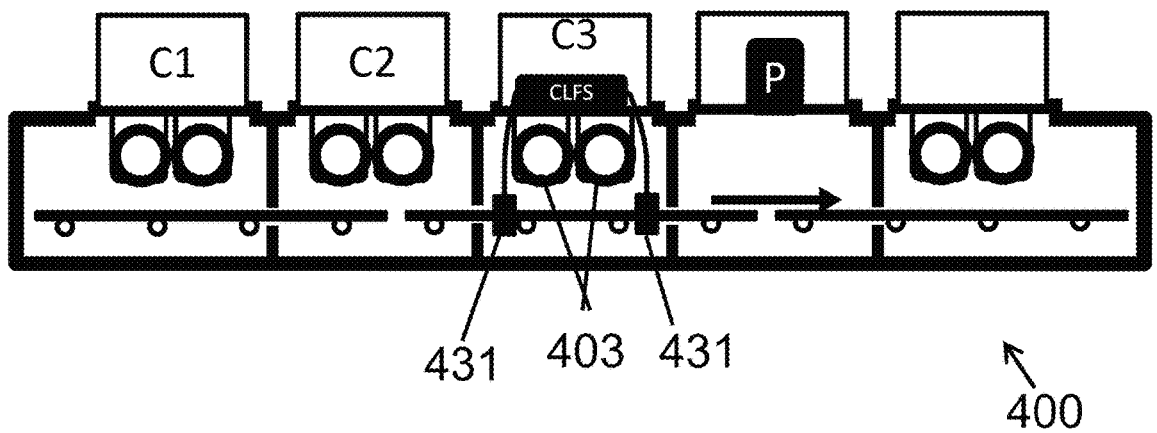

FIG. 15 schematically shows a sputtering device comprising two sensor units on a same cover, one before and one after the sputter cathode, in accordance with embodiments of the present invention.

Figure 16:
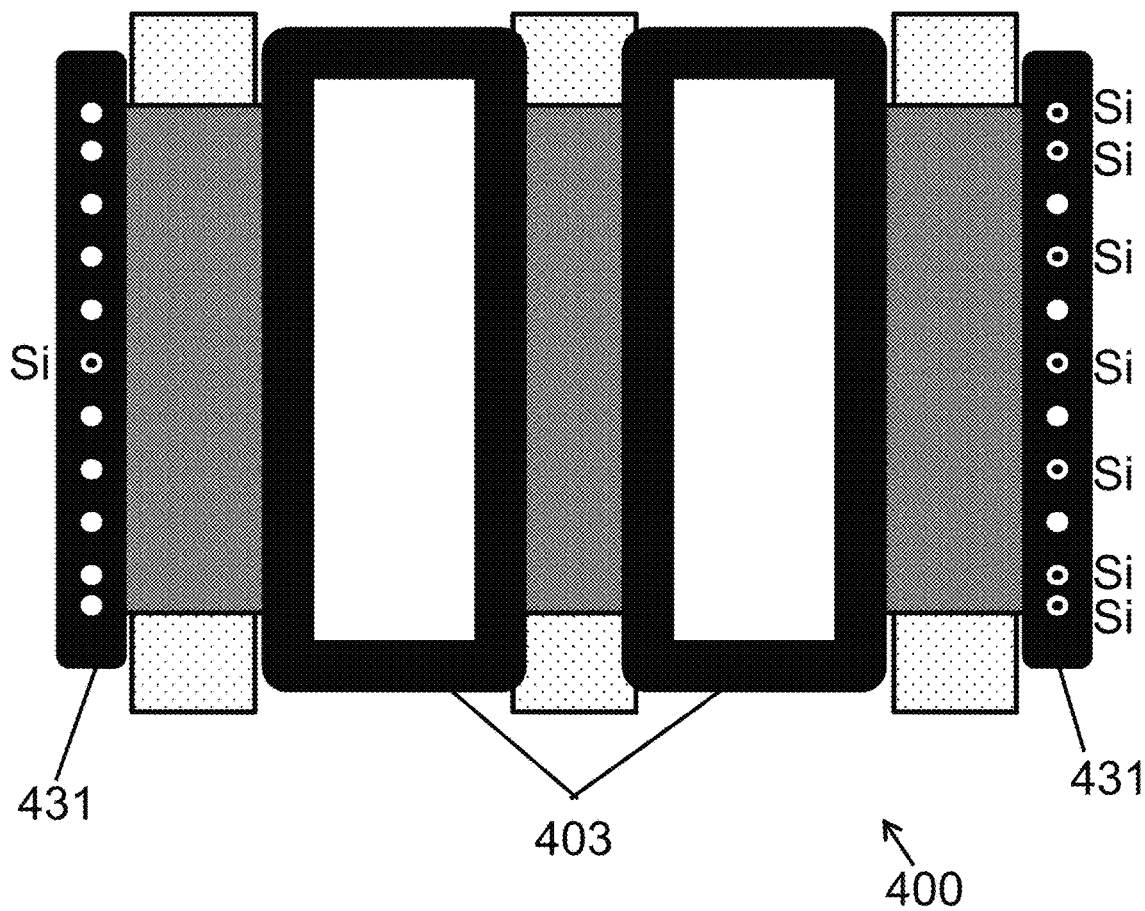

FIG. 16 schematically illustrates the same sputtering device as in FIG. 14. Only the part with the two sensor units is shown, in top view.

Figure 17:
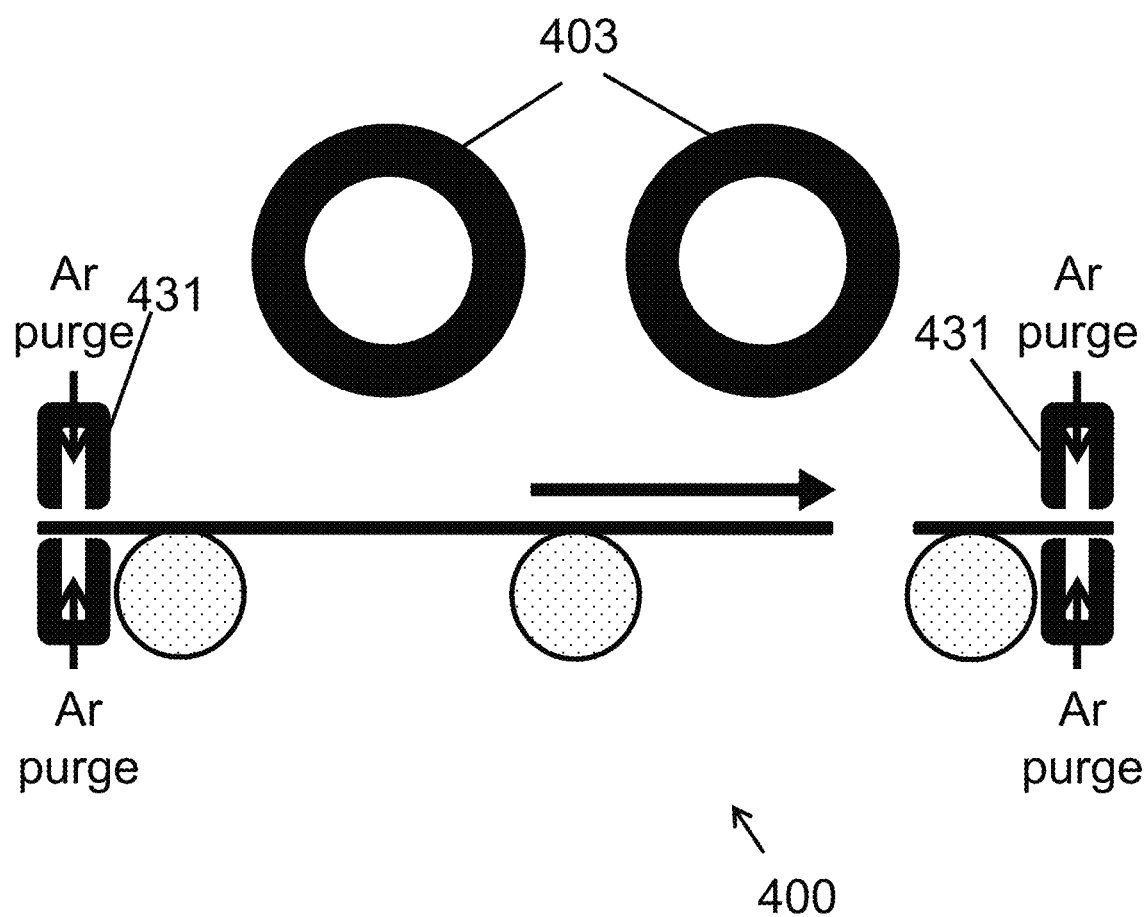

FIG. 17 is a side view of the sputtering device shown in FIG. 16.

DETAILED DESCRIPTION OF EMBODIMENTS OF THE INVENTION

The present invention will be described with respect to particular embodiments and with reference to certain drawings but the invention is not limited thereto but only by the claims.

It is to be noticed that the term 'comprising', used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression 'a device comprising means A and B' should not be limited to devices consisting only of components A and B. It means that with respect to the present invention, the only relevant components of the device are A and B.

Reference throughout this specification to 'one embodiment' or 'an embodiment' means that a particular feature, structure or characteristic described in connection with the embodiment is included in at least one embodiment of the present invention. Thus, appearances of the phrases 'in one embodiment' or 'in an embodiment' in various places throughout this specification may, but do not necessarily, all refer to the same embodiment. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

By 'coating stack' is meant a stack of multiple layers, which may differ in composition, and wherein each layer has a thickness from 1 nm to 10 µm, and typically from 3 nm to 200 nm.

Where in this document reference is made to 'inside of a cover', reference is made to that side of the cover which is facing inwards during normal use (facing the zone with the vacuum).

Where in this document reference is made to 'outside of a cover', reference is made to that side of the cover which is facing outwards during normal use (facing the zone with atmospheric pressure).

FIG. 1 and FIG. 2 have already been discussed in the background section.

FIG. 3 shows a non-flexible sputtering system 300 having three sputtering zones 301, wherein, downstream from the first sputtering zone 301a a first in situ sensor system 311 is installed, downstream from the second sputtering zone 301b a second in situ sensor system 312, and downstream from the third and final sputtering zone 301c an ex situ sensor system 310. Although not explicitly stated in WO2014/105557A1, it is customary in the prior art to fixedly attach in situ sensor systems to a fixed wall of the sputtering chamber, at a fixed place where no sputtering is done in the immediate vicinity, such that the sensors are not immediately contaminated and become unusable. Since this sputtering system 300 needs to sputter only three layers, and moreover always with the same materials and the same layer thicknesses, and because no sputtering stations have to be left 'unused' or 'skipped', the two in situ sensor systems 311, 312, will in practice be fixedly mounted to a wall of the sputtering device, because there is no reason to move them. Indeed, a person skilled in the art will try to attach the sensor systems as securely as possible so as to keep any tolerances of the measurements as low as possible, and in order to avoid frequent calibration or recalibration. Such a line is particularly suitable for the coating of stacks with a small number of layers and extremely large batch sizes, as is typically the case for coaters for PV devices. The price of two in situ sensor systems 311, 312 is justified for such a sputtering system in order to ensure quality, but this solution cannot be readily scaled to an installation with e.g. fifty sputtering stations.

WO2014/105557A1 seems to suggest that the ex situ sensor system can perform measurements at multiple lateral positions, but does not say this about the in situ sensor systems. In the context of WO2014/105557A1, it furthermore does not appear very useful to carry out such measurements at multiple lateral locations, since the only parameters that can be adjusted online in this system are the individual powers of the sputtering targets and the speed of the conveyor belt of the whole system. This implies that, if lateral deviations were to occur systematically in this system, e.g. a local thickening of a particular layer, the system would have to be shut down, and that off-line local modifications on the machine would be required.

Whereas FIG. 3 shows a setup of a sputtering system for coating a fixed coating stack with only a very limited number of layers, and very large batches, FIG. 4(a) shows a schematic representation of a prior art configurable sputtering system, adapted for producing a configurable coating stack. The present invention focuses mainly on such a type of configurable sputtering system.

Typically, such a configurable sputtering system includes at least five, e.g. at least fifteen, e.g. at least thirty up to even fifty or even more zones 401, in which typically either a sputtering target (schematically represented by two circles), selected from up to twenty to thirty different materials, or a pump system (schematically represented by a circle with the letter 'P') can be inserted via a cover 402, which are appropriately placed depending on the coating stack to be produced, at the request of the customer. Such a cover 402 (schematically represented by a rectangle) is also referred to as a 'lid' or 'door', and can e.g. be mounted at the top of a sputtering system and/or to a side. Such a flexibly adjustable or configurable sputtering system is ideally suited for coating relatively small batches, each with a specific but varying coating stack that includes a relatively large number of layers, e.g. at least three, at least six, or e.g. at least ten, or e.g. at least fourteen, or even more than fourteen coating layers. To allow a great flexibility, the zones of such a system may be equipped as one sees fit with one or more sputtering targets of certain materials, and in a predetermined order, to obtain the desired stack design. Pump zones can also be incorporated flexibly, typically for separating different target materials, or different layers or different processes. It is an advantage of such systems that the components, e.g. the covers, the sputtering targets, and the pump units, are interchangeable between the different stations.

The existing configurable sputtering systems 400 as shown in FIG. 4(a) generally contain only an ex situ sensor system 410 to measure properties of the entire coating layer. This is usually a traversing system, in which a measuring head can move across the width of the substrate. In known systems, typically the degree of reflection and colour are measured and verified, but such a measuring system does not allow the individual layer thicknesses to be determined therefrom. Provided use is made of spectral measurement data from the ex situ measuring system 410 and a computer system with a software package for optical modelling, the most likely actual layer thickness of each deposited layer can only be calculated by approximation, based on the parameters of the coating stack to be produced and based on the known material properties. The uncertainty increases as the coating stack contains more layers and/or as the measuring accuracy decreases. In order to obtain a higher accuracy of the properties of individual layers, and thus of the complete stack, other techniques must therefore be used, such as destructive testing (e.g. by etching away certain layers), resulting in large time delays, which is not practicable for relatively small batches. Consequently, the adjustment of the sputtering zones (e.g. based on gas pressure or power) is not easy. If one also wishes to check the layer properties and their uniformity over the surface of the substrate, the number of measurements and the preparation of the samples will very rapidly increase.

In order to increase the quality of the coating stack, by analogy with WO2014/105557A1, those skilled in the art could place an in situ sensor system downstream from each sputtering station 401 (also referred to as 'sputtering zone'), permanently installed in the installation, but, in practice, this is not feasible because: (1) the sputtering system would become very much longer and thus more expensive, (2) it would not be necessary to perform a measurement downstream from every sputtering position for each stack design because this position might actually not even be active or because that particular layer might not even be critical, and (3) because a sensor system is expensive to purchase and requires maintenance, meaning that the entire process is not economically feasible.

The inventors were therefore looking for a more flexible solution, and devised the following: instead of incorporating an in situ sensor system in the sputtering system 400 downstream from each sputtering station 401, they propose to provide a cover (or lid or door) with attached or mounted thereto an in situ sensor system 421, such that this cover 420 with in situ sensor system 421 can be easily and flexibly moved in the sputtering system 400, on an existing aperture which was formerly provided for the insertion and mounting of a sputtering target or a pump system. The idea is to not provide a cover 420 with an in situ sensor system 421 downstream from each sputtering station 401, but to provide only a limited number of such covers 420 with in situ sensor system 421 (e.g. two to five covers for a sputtering system having fifty stations), and to place these at the 'most suitable' location(s), depending on the specific coating stack which is to be produced, e.g. the 'most sensitive' location(s), e.g. just upstream and just downstream from the sputtering zone in which variations of the layer thickness will have the most influence on an essential property, such as the colour or transparency of the complete coating stack, or, e.g. every three or every five or every ten sputtering stations, or e.g. between two sputtering stations which both sputter a material having substantially similar properties. By measuring the partial stack having only one of these two layers with similar properties, it is possible to make a distinction between the influence of the first and the second layer, which is no longer possible at the end of the line (ex situ), because then only the combined influence can be measured.

Certain embodiments of such a movable cover with measuring system can further be designed to measure the sensitive property in multiple places, e.g. in a specific area of the substrate (e.g. over a portion or over the whole lateral width, and since the substrate moves in the longitudinal direction, therefore over substantially the entire substrate surface), so that it becomes possible to verify the uniformity of the property over the specified region, and to optionally adjust it. Such measurement will be discussed further with reference to FIG. 10; such adjustment will be discussed further with reference to FIG. 5 and FIG. 6.

Thanks to the simple mounting and demounting of the cover 420, (in contrast to typical in situ measuring systems, which are fixedly mounted in installations such as the one shown in FIG. 3), this choice of the 'most appropriate' location(s) can without too much effort be revised and adapted for each specific coating stack to be produced (similar to the effort required for fitting of a different sputtering target at that location). It is therefore a major advantage that the cover 420 with the in situ sensor system 421 can be moved in a relatively simple way to other (existing) apertures of the sputtering machine, obviously after removal of e.g. a sputtering target or a pump system that had already been inserted into that aperture.

In FIG. 4(a) to FIG. 4(d) a number of examples of a configurable sputtering system according to the present invention are shown, as well as examples of a cover with a sensor system.

FIG. 4(b) shows an example of such a configurable sputtering system 400 according to according to the present invention, in which the first two stations are sputtering stations, wherein at least a first and a second sputtering target have been included (there are two circles drawn in the schematic drawing, but there may also be less than two or more than two sputtering targets present in each station), and a third zone to which a cover 420 according to according to the present invention with an in situ sensor system 421 is attached (schematically represented by a circle with the text 'Si').

The sensor system 421 may comprise e.g. at least one light source and at least one corresponding spectral detector, which are movable on a first and second rail, respectively, said rails e.g. extending in a transverse direction, e.g. perpendicular to the direction of movement of the substrate, and which (during operation) are located on opposite sides of the substrate, as shown in FIG. 10(c). The sensor system 421 may, for example, be adapted for measuring the spectral transmission property in the thickness direction of the substrate, at multiple measuring positions distributed over substantially the entire width of the substrate (perpendicular to the direction of movement of the substrate). Other examples of sensor systems will be further explained, inter alia, in the discussion of FIGS. 7, 8 and 10.

In the example of FIG. 4(b), the sputtering system 400 has only one such cover 420, and therefore only one in situ sensor system 421, but the invention is of course not limited to sputtering systems 400 with only one such cover 420, and multiple stations may also be provided with a cover 420 with a sensor system 421 for carrying out multiple in situ measurements. The sputtering device can optionally also comprise an ex situ sensor system 410, with e.g. similar characteristics as the ex situ sensor system described in WO2014/105557A1.

Of course, it would be possible, with a sputtering system 400 of e.g. fifty stations, wherein, for a specific coating stack with e.g. fourteen layers, e.g. only thirty stations are used, to also use fourteen covers 420 with an in situ sensor system 421, placed after every last sputtering station of an individual layer, but as mentioned earlier, this is both very expensive and unnecessary, especially if the successive layers are sufficiently different in terms of the property that is to be measured, e.g. spectral transmission property, spectral reflection or other property, e.g. electrical or mechanical or thermal property, or combinations thereof, e.g. thermo-optical property. The addition of a single cover 420 with sensor device 421 after each sputtering station is actually no longer possible with this sputtering system (with fifty stations) if a coating stack has to be produced that includes e.g. forty layers. Then one would be required to reduce the number of stations or zones with a cover 420 with a sensor system 421 according to the present invention to a maximum of ten covers, and in such cases, the advantages of the present invention will become even more apparent.

FIG. 4(c) represents a further embodiment of a cover according to the present invention, the cover 430 with the in situ sensor system 421 further also comprising a pump system 432. A cover with a pump system attached thereto is, per se, known, but not in combination with an in situ sensor system 421. Such a cover 430 that combines a pump system with a sensor system offers the additional advantage that a single cover (i.e. a single station) can be used for two different functions (namely: measuring and pumping), thereby saving space. More specifically, such a cover 430, with both an in situ sensor system 431 and a pump unit 432, makes it possible to also provide each zone in which there was previously only a pump unit now also with the functionality of performing an in situ measurement, without having to use additional stations 401. In this way, the quality of the coating stack can be significantly increased, as well as the percentage of products which meet the predefined specifications of the complete coating stack, without needing to add additional positions (e.g. stations) in order to be able to introduce a sensor system. This also allows a reduction of the tolerances regarding the specification of such coating stacks. A similar advantage may be achieved by introducing at least one sensor system mounted on a sputter unit comprising sputter targets.

As mentioned above, the sensor system may be e.g. an optical sensor system, comprising at least one light source and at least one light detector (e.g. adapted for performing a transmission measurement of a reflection measurement), or an electrical sensor system (e.g. configured for measuring an electrical resistance between two points), or some other sensor system.

In a preferred embodiment, the easily movable cover without pump unit 420, or with pump unit 430, includes an optical sensor system suitable for measuring transmission and/or reflection properties. In other embodiments, the sensor system may be suitable for performing polarised measurements (e.g. ellipsometry), and/or adapted for measuring mechanical, magnetic, thermal and/or electrical properties, or combinations of optical, polarised, mechanical, magnetic, thermal and electrical measuring systems.

The measurement of an optical transmission property imposes less stringent requirements on the positioning of the light source and the detector than, e.g. an optical reflection measurement, and the light source and the detector can therefore relatively easily be mounted on a movable and removable cover. However, it is advantageous to carry out the necessary calibration of the sensor system. Such calibration may e.g. take place after the mounting of the cover 420, 430 to an aperture, but may also (although momentarily) take place during a production run between two substrates (e.g. between two glass plates), when the detector which is normally located on one side (e.g. the bottom) of the substrate, can directly 'see' the radiation (e.g. light) that is radiated by the radiation source (e.g. the light source) on the other side (e.g. the top) of the substrate, because for a brief period there is no substrate between the light source and the detector.

In a preferred embodiment, the light source is adapted for transmitting a light signal with a relatively broad spectrum, e.g. in the range from 300 to 2000 nm, e.g. in the range from 350 to 1000 nm. Such light sources and detectors are known to the skilled person. The use of such a relatively broad spectrum makes it possible for the modelling software to apply 'curve fitting', which greatly increases the accuracy of layer thickness measurement.

In an embodiment, the sensor system 421, 431 of the cover 420, 430 may comprise multiple radiation sources, e.g. light sources and multiple detectors, wherein at least one radiation source is provided to radiate to at least one detector through the substrate and through the partial coating stack. The radiation sources and the detectors may be mounted on a rail, the rail preferably extending in a direction perpendicular to the direction of movement of the substrate in the sputtering system, although this is not necessary.

In the above-described embodiments, the processing unit or analysis unit M2 for the processing of the received or measured signals have not been explicitly discussed, but it will be appreciated that such a processing unit may be present on the underside of the cover (inside the station), such as in the prior art.

Due to the fact that the sensor system of the cover is actually attached to the cover (and not to a wall), it is also possible to mount the processing unit on top of the cover, outside the station. This is not readily possible in the sputtering device of FIG. 3, because a person skilled in the art would not purposefully create apertures in the wall for the passage of cables or the like, although this is perfectly possible with a cover according to the present invention. This is a major advantage, since the processing unit is usually very expensive and very sensitive equipment, which, when used in conjunction with a cover of the present invention, can be placed outside of the vacuum. This also allows for a simpler operation (e.g., accessibility of buttons).

But there is more. The inventors have in fact realised that the flexibility and modularity can still be increased further, by not fixedly mounting the processing unit or analysis unit to the associated sensor system, but by making it movable, and thus interchangeable between different covers of the same type. This is explained with reference to FIG. 4(*d*), which shows a configurable sputtering system 400 according to the present invention, with two stations to which a cover according to the present invention is mounted (in the example, station 3 and the penultimate station), and wherein the processing unit M2 is detachably mounted to the cover of the penultimate station. Because the processing unit M2 is detachably attached to said cover, this processing unit can easily be moved to the cover of station 3, both during a production run, as well as between two production runs. It is an important advantage that this movement is possible without having to break the vacuum (as only the processing unit needs to be moved, not the covers with the sensor system). This advantage should not be underestimated. It allows e.g., inter alia, multiple batches of different coating stacks to be produced, without having to swap the cover of (in this example) the third and penultimate station, thus saving time. One only has to swap the processing unit M2, which is much easier and faster. And if sputtering targets need to be replaced all the same, and the vacuum nevertheless has to be broken, then the modular aspect of the present invention still offers an advantage, because the processing unit only has to be changed after the vacuum pump is started, which again saves time.

In other embodiments of configurable sputtering devices with e.g. twenty stations, and three covers with a sensor system M1 according to the present invention, and two processing units M2, e.g. one of high quality (M2*hq*), and one of normal quality (M2*nq*), the operator can choose to e.g. mount the three covers to the sputtering installation, and to provide one of the three covers with the M2*hq*, and to provide a second cover with the M2*nq*. Quality of the processing unit M2 may cover, but is not limited to, signal sensitivity, measurement range, accuracy, signal stability, S/N ratio and other specific features of metrology equipment. If, during the production run, it becomes apparent that the processing units would better have been mounted on a different cover, this can be adjusted without any problems, without having to interrupt production, and above all without having to break the vacuum.

Thanks to the flexibility and modularity offered by the present invention, both the quality of the finished product, and the efficiency of the installation can be increased appreciably, and the costs kept under control.

In FIG. 5 and FIG. 6, examples of a feedback system according to the present invention will be explained.

FIG. 5 shows a sputtering system 500 such as shown in FIG. 4(*b*) to FIG. 4(*d*), further comprising a computer system 540, provided with necessary software for the processing of the signals originating from the one or more in situ sensor systems, as discussed above, which are mounted to the one or more covers, whether or not together with a pump system. The software is adapted for calculating the most likely thickness of the different layers of the partial coating stack, based on the measured values or properties or characteristics, e.g. based on the measured spectral reflection and/or transmission curves.

Optionally, the computer system 540 is further adapted for processing the ex situ sensor signal 510 and, optionally, the software is further adapted for calculating the various layer thicknesses of the complete coating stack, although this is not strictly necessary for the present invention.

In a variant of the system shown in FIG. 5, there is a first computer system that only processes the signals of the in situ sensor systems, and there is a second computer system that processes only the signals of the ex situ sensor system. The values calculated by the first computer system can then be used as 'known' data for the second system, although this too is not strictly necessary. If desired, the second system can work completely independently. In this way, the second system may e.g. be used as verification (redundancy) of the first system, albeit typically with a lower accuracy.

Similar software packages as mentioned in WO2014/105557A1, in the form of 'OptiRE' of OptiLayer, or 'BREIN' of W. Theiss Harden Software, or 'TFCalc' of Software Spectra Inc., may also be used in embodiments of the present invention, and in addition to the sensor signals themselves, the software can also in this case use material properties, such as the spectral transmission factor of a particular material for a given wavelength. However, as described below, additional functionality may be desirable.

In preferred embodiments of the present invention, the software package further comprises a software module, such as e.g. for determining the most sensitive layer of a particular coating stack, and/or a software module for determining the appropriate locations (e.g. the most sensitive locations) for placing a given number of covers with sensor system M1 and with processing unit M2 connected thereto (as discussed in FIGS. 4(b) and (c), based on one or more coating stacks to be produced. Optimisation over multiple production runs of different stacks may further shorten the conversion time of the installation. Referring to FIG. 4(d), the software module may also be adapted for the determination of the most suitable positions for the placement of covers with sensor system M1, and the most suitable positions of a predetermined number of processing units M2 mountable thereto. It may be advantageous to place covers with a sensor unit M1 but without a processing unit M2, even if they are not always functionally used, for the purpose of optimisation across multiple production runs with different coating stacks, in order to reduce the total conversion time.

The software can also be adapted for calculating the actual thicknesses of the various layers of the coating stack, as well as the deviation from the envisioned thicknesses, and optionally to display them on a screen 541, so that, if desired, an operator can make the necessary adjustments to e.g. the gas pressure of the installation, or to the power of one or more sputtering targets, or, if necessary, stop the machine, and manually adjust manually adjustable magnets of a sputtering target with such a facility.

The software can also be adapted for calculating the actual optical properties of the various layers of the coating stack, as well as the deviation from the envisioned values of the refractive index and absorption coefficient, and optionally to display them on a screen 541, so that, if desired, an operator can make the necessary adjustments to e.g. the gas pressure of the installation, or to the power of one or more sputtering targets, or, if necessary, stop the machine, and manually adjust manually adjustable magnets of a sputtering target with such a facility.

The software may contain unique features that are not readily found in standard software packages as described earlier. A specific algorithm may be implemented for e.g. the case of the sputter unit having a sensor system at the start and at the end of a cover carrying a sputter target (cathode lid). The sensor system at the start of the cathode lid may measure the initial status of a certain property as it is defined by the substrate and the various layers that may already be present on the substrate. At this point, it may be unclear or unknown what the exact composition is of all the layers already present on the substrate. The sensor system at the end of the cathode lid may measure the status of a certain property after an additional layer has been deposited by this specific sputter unit. By evaluating the variation of the measured property between the start and the end of the cathode lid due to the deposition of a layer by the sputter unit, the software may be able to calculate specific properties of the final layer that has been deposited, such as the thickness or optical properties. In this case, the measurement of the sensor system may be e.g. a transmission spectrum of the product that is entering and leaving the specific sputter unit.

The software may contain a computer algorithm, allowing the calculation of a layer property of a single layer (preferably the last layer, being on top) as being part of layer stack, while the composition and properties of the other layers of that multilayer stack are a priori unknown. The layer property can be the thickness or can be an optical property (e.g. refractive index n or absorption coefficient k) or any other property. The process for achieving and controlling this layer in production as being part of a multilayer stack can make use of a calibration procedure. Such a procedure is useful for the correct configuration of parts of the system, such as sensors and/or in the identification of black box, white box or grey box models. These models can be used for instance (in support of) a feedback control system where at least one property is controlled in closed loop, an intelligent assistant system that provides the operator with suggestions to adjust process parameters or as an observer system flagging any anomalies or deviation in the process state.

The present invention also focuses on the measuring system comprising the cover 530 with the in situ sensor system 531 and the computer system 540 with the software, without the ex situ sensor system 510 and without the rest of the sputtering installation (in particular, the stations and the sputtering targets). It is noted that the pump unit 'P' is shown with a dotted line, to indicate that the pump unit is an optional part of the cover according to the present invention.

The present invention is also related to the measuring system comprising the cover 530 with the in situ sensor system 531 and the ex situ sensor system 510 and the computer system 540 with the software as described above, without the rest of the sputtering installation (in particular, the stations and the sputtering targets).

In a particular embodiment of the sputtering system 500 according to FIG. 5, the sputtering system comprises at least one sputtering target with at least one on-line adjustable magnet, as described in WO2013120920A1, and the software is further adapted for calculating a profile of, e.g., the layer thickness across the transverse direction, based on the one-dimensional or two-dimensional information from the in situ sensor system 531, and optionally also based on the one-dimensional or two-dimensional information from the ex situ sensor system 510. Deviations can e.g. be displayed on a screen 541, and an operator can, if desired, e.g. manually but on-line (i.e. without stopping the sputtering system) make adjustments with respect to the adjustable magnets. The additional functionality of being able to adjust locally and on-line at various places in the lateral direction is not possible with the known system of FIG. 3. However, this system offers major advantages. For example, the yield of products that have to meet the predefined specifications may be greatly increased, which is all the more important when producing relatively small batches (where the start-up time must be small compared to the actual production). Furthermore, such an installation is capable of producing coatings to increasingly stringent requirements (lower tolerances). Moreover, such a system makes it possible to use a (e.g. cylindrical) sputtering target for a longer period than has hitherto been the case, since there is always a certain degree of non-uniform erosion of the sputtering material, which results in a non-uniform deposition on the substrate, but by measuring at various points in the lateral direction of the substrate, and adjusting the magnets accordingly, the negative effects of the non-uniform erosion can be largely compensated.

The sputtering system 600 of FIG. 6 goes even one step further, and includes not only at least one sputtering target 660 with at least one on-line adjustable magnet, preferably a plurality of sputtering targets, each with a plurality of on-line adjustable magnets, but further includes also at least one actuator 650 for automatically adjusting these magnets. In this case, the computer system 640 further comprises a software module for controlling the at least one actuator 650 of the at least one on-line adjustable sputtering target 660, for obtaining e.g. a more uniform thickness according to the predefined specification of the relevant production run. Of course, the data can also be displayed on a screen 641, in order to allow an operator to monitor the process. The software can optionally be adapted to operate fully automatically without operator intervention, or may propose adjustments to the operator, while only effecting them after approval by the operator, etc. In addition to automatically adjusting the position of the at least one, preferably the plurality of on-line adjustable magnets of the sputtering target(s), other parameters of the sputtering system may of course also be adjusted, such as e.g. the power of one or more sputtering targets, or the partial pressure of the individual gases in the sputtering installation, both locally and globally over the target surface.

The particular embodiment of the sputtering system 600 shown in FIG. 6 thus comprises at least one sputtering target with at least one on-line adjustable magnet, preferably multiple on-line adjustable magnets, as described in WO2013120920A1, and at least one cover 630 provided with a sensor system 631 for the in situ measurement of a property of the coating stack (e.g. an optical or mechanical or magnetic or other characteristic) at at least one location preferably at several locations in the transverse direction of the substrate, and further comprises a computer system 640 having a software package (e.g. 'BREIN') for calculating at least one property of the layer, e.g. the layer thickness originating from the one or more sputtering targets with at least one, preferably multiple, on-line adjustable magnet/magnets at at least a number of discrete positions across the width of the sputtering target, and the computer system 640 is further provided with a software module for the automatic adjustment of the on-line adjustable magnet/magnets of the sputtering target 660 in order to obtain the envisioned thickness of the corresponding deposited layer.

Optionally, also the data from the ex situ sensor system 610 can be taken into account, although this is not strictly necessary for the present invention.

It will be understood that a sputtering system 500, 600 according to FIG. 5 or FIG. 6 with one or more on-line adjustable magnet/magnets will be better able to provide a uniform thickness over the whole width of the substrate, in view of the many degrees of freedom relating to the ability to measure and adjust locally, in contrast to the sputtering system shown in FIG. 3, where such measurement results are used to calculate an average thickness, and on this basis to adjust a global sputtering parameter, e.g. the power of the sputtering target or speed of the conveyor belt of the entire sputtering system. This is all the more the case for (e.g. cylindrical) sputtering targets having a length of at least 2 m, e.g. at least 3 m, e.g. at least 4 m, in which non-uniform erosion of the sputtering material can lead to non-uniform deposition on the substrate. With the present invention, such non-uniform deposition due to non-uniform erosion (or for any other reason) can at least partially be compensated, either manually (see FIG. 5), or semi-automatically, or fully-automatically (see FIG. 6).

In particular embodiments, the software, in addition to merely measuring properties of the coating stack, and therefrom calculating the layer thicknesses, and adjusting the sputtering targets to achieve the envisioned properties and/or layer thicknesses, can further also be adapted so as to for each substrate, during the production process, keep track of any deviations that occurred in upstream stations (e.g. a 3% thinner first silver layer than envisioned), and to compensate this deviation in whole or in part by adjusting downstream stations (e.g. a 3% thicker second silver layer than envisioned).

In FIG. 7 and FIG. 8, some examples of optical sensor systems that may be used as part of a cover according to the present invention will be explained in more detail.

FIG. 7 shows a linear light source 761, which can extend e.g. locally but also over a larger area of the substrate 762. This can be e.g. (a) a fluorescent lamp or (b) consist of multiple smaller light sources (e.g. LED, arc discharge lamp, etc.) with a diffusion screen or light-guiding systems or (c) an electroluminescent lamp or a different source to uniformly spread light. This source 761 may be static or move along with the sensor or detector 763.

FIG. 7 may also display a sensor system in which the light source 761 is movable, and the detector static, or vice versa, or in which multiple light sources 763 or detectors are present, e.g. fixedly or movably mounted to a rail that extends in a transverse direction with respect to the direction of displacement of the substrate (as represented by the arrow).

In the context of the present invention, the term 'sensor' or 'detector' are synonymous. The sensor can be a very complex sensor, e.g. an integrated chip provided with optical elements and integrated circuits for determining spectral components of incident light, or may be a simple passive component, such as a lens, or any other suitable sensor. The intelligent sensor can then send the result in electrical form (e.g., analogue or digital), e.g. to a computer which is located outside the vacuum chamber, making use of a transmission medium, e.g. an electrical cable, or even a wireless connection. The simple sensor (e.g. the lens) can detect the optical signal and pass it on via a transmission medium (e.g. an optical fibre), so that the signal can be processed outside of the cover.

FIG. 7 thus shows examples of an optical sensor system 721 that can be mounted to a cover, and can be used as an in situ sensor system in a station of a sputtering system. The shown sensor system comprises a radiation source 761, e.g. a light source and a radiation detector 763. According to embodiments of the present invention, the light source and the detector are both attached to the lid or cover, and in such a way that when the sensor system is inserted into the aperture of a station, and when the cover is attached to the aperture, the substrate 762 will move between the light source and the detector during operation of the sputtering installation. This setup is e.g. highly suited for measuring optical transmission properties through the substrate and through the already deposited coating layers (i.e. the partial coating). The substrate 762 with the coating 764 is shown in a dotted line because it does not belong to the lid or cover.

In the embodiment shown in FIG. 7, (during use) the light source 761 can be located in the vacuum chamber, although this is not strictly necessary, and it is also possible to place the light source 761 outside of the cover, and to pass on the emitted light via a transmission medium, e.g. an optical channel, e.g. an optical fibre. Generalised to other characteristics, e.g. electrical, magnetic, thermal, etc., the excitation source does not necessarily have to be located inside the station (at the bottom of the cover), but can also be placed outside the cover, provided that the source signal is then fed to the inside in another way. The source can either be fixedly mounted to each cover, or can be detachably and movably attached to the cover. In this way, the flexibility and modularity of the sputtering system can once again be increased. Thus a sputtering system may comprise e.g. three covers, all equipped with a single optical fibre for supplying a source signal, and equipped with a single optical fibre for carrying off the measured signal, and e.g. only one single source of radiation needs to be used, which can be mounted to one of the three covers, and which can, if desired, be moved to one of the other two covers, without having to move the three covers, i.e., without breaking the vacuum.

FIG. 8 shows another example of an optical sensor system 821 as part of a cover 420, 430 according to the present invention, which can be used as an in situ sensor system in a station 401. The displayed sensor system comprises a radiation source 861, e.g. a light source and multiple radiation detectors 866, 868, which can e.g. be connected to an external processing unit, e.g. a readout unit, by means of optical fibres (as shown in FIG. 9). This sensor system is suitable for measuring both a reflection characteristic as well as a transmission characteristic, although this is not necessary for the present invention, and only a reflection measurement may also suffice Above it was already explained how a transmission measurement can be performed, where the light source and the detector are placed on opposite sides of the substrate. And here, too, it is possible to mount the light source 861 either at the bottom of the cover (inside the chamber), or outside it. FIG. 8 shows an approach in which use is made of an integrating sphere or Ulbricht sphere 870 which evenly divides the light from a light source. The sensor tip as shown in FIG. 8 can carry out a detection at three locations: a calibration signal (detector 868), a reflection signal (reflector 866), and a transmission signal (detector 863). Here, too, the processing of the detected signals need not necessarily take place in the sensor system itself but can, e.g., also be guided to the outside via optical fibres 867a, 867b, such as e.g. glass fibres. Here, too, the light source 861 may be mounted in the chamber (at the bottom of the cover), or outside the cover (e.g. under atmospheric pressure), whereby in the latter case, the optical signal is distributed within the sphere 870 via an optical fibre or another light conductor (not shown). The use of an Ulbricht sphere 870 allows alignment problems or effects of slight displacements of the substrate 862 relative to the measuring system (e.g. caused by vibration, transport, deflection, variable thickness, etc.) to be reduced or minimised. Other techniques may also be used to potentially absorb deviant light transmissions, e.g. by mounting lenses to e.g. source and/or the detectors.

As shown in FIG. 9, multiple optical fibres 967 can be placed outside the vacuum chamber, and connected to an optical multiplexer which sends the signals, one by one, to an optical detector, e.g. a spectrophotometer 982 as example, or as part of a processing unit M2. The size of the multiplexer 981 (e.g. three-channel, e.g. 15-channel, e.g. 42-channel or more than 42-channel) is determined by the number of signals received by the sensor system M1 (see FIG. 8). The optical sensor system M1 and the processing unit M2 (comprising e.g. 981, 982) may optionally be adapted to be easily mounted to and dismounted from the cover, so that a modular solution is obtained. In this way it is e.g. possible to use both a low-resolution spectrophotometer and a high-resolution spectrophotometer in a single sputtering system, and these are easily interchangeable, without having to change the covers themselves. In this way, e.g., the desired accuracy or bandwidth (e.g. wavelength range) can be easily adjusted, depending on the coating stack(s) to be produced, in order to obtain the required accuracy. Alternatively, this system of detection and processing can be kept simple if the coating layer system permits.

Working with a moving source and detector (e.g. the complete sphere 870 can be moved), or with a moving source and multiple of fixed detectors, with multiple sources and a moving detector or with multiple discrete measuring points, each consisting of source and detector, can once again be considered for the setup of FIG. 8. The system may be constructed modularly, e.g. number of measuring points, source quality and detection quality according to the desired accuracy that one wishes to achieve at that position in the sputtering system.

Although the examples of FIG. 7 to FIG. 9 show optical sensor systems, it will be clear that other sensor systems may also be used, e.g. for measuring mechanical properties (e.g. thickness, deflection, etc.), or magnetic properties (e.g. through the use of a Hall sensor), or electrical properties (e.g. resistive, capacitive, etc.) or thermal properties, or combinations of these (e.g. thermo-optical properties), and not necessarily limited to pure optical measurements. Of course, non-contact measurements are preferred.

Instead of using a detector with a relatively broad spectrum (e.g. a spectrum bandwidth of at least 500 nm), a detector with a narrower, e.g. specific spectrum range, may also be used for specific applications. This may mean that the detector can measure with higher accuracy and/or at a higher speed. As a result, the data stream may also be limited.

FIG. 10 shows some of the measurement setups described above in top view.

FIG. 10(a) shows e.g. a single-point measurement, with a single local light source that is located e.g. above the substrate, and a single detector which is located below the detector, or vice versa. The light source and the detector are mounted at a fixed location, schematically represented by a black dot.

FIG. 10(b) shows a multi-point measurement, with five light sources located above the substrate and five detectors located under the substrate, or vice versa, but the number of detectors can of course also be less than five or more than five.

FIG. 10(c) shows a moving point, also called a 'scanning point', where one light source and/or one sensor are movably arranged, e.g. on one rail or on two rails, for performing measurements at different lateral positions. The substrate is only shown in FIG. 10(a) for illustrative purposes, to indicate the relative positions of the sensor system and the substrate. In the arrangement shown in FIG. 10(a), the measurement is done in the centre of the substrate. The substrate 1062 moves in the direction of the arrow. When the substrate is not located between the light source and the detector (as shown), a calibration measurement, e.g., can take place. The system of FIG. 10(c) allows a measurement to be taken at any given lateral position, while the configuration of FIG. 10(b) only allows a measurement at a few discrete positions. A person skilled in the art can take several aspects into account when determining the most suitable system, such as: the purchase price, risk of defects, sensitivity of the measurement to displacement of the sensor (e.g. in the height direction), performance of the system required for the processing of the measurement data, etc. Thus, e.g., the system of FIG. 10(*c*) may be less expensive than a large number of, e.g. twenty, discrete sensors, but the measurement results might be e.g. less accurate due to vibrations caused by the displacement.

A person skilled in the art can configure the measuring system, i.e. select a (e.g. the most) suitable in situ sensor system and a (e.g. the most) suitable processing system for the envisioned application(s), in particular, based on the coating stack to be measured, and even based on the position in the system, or even based on multiple coating stacks that will be produced in succession, e.g. with a view to quality, and/or with a view to the shortest possible conversion time. The skilled person may also combine different systems. For example, the sensor system of FIG. 10(*a*) might be useful for measuring a characteristic of the uncoated substrate (i.e. before a single layer is deposited), or downstream from a sputtering station with a sputtering target of which only the power can be controlled, and it could e.g. be interesting to use the sensor system of FIG. 10(*b*) downstream from a sputtering station with a sputtering target with off-line or on-line adjustable magnets. In this case, it may be, e.g., highly advantageous to coordinate the number and position of the measuring points with the number and positions of the adjustable magnets. The sensor system of FIG. 10(*c*) can, e.g., be conveniently used downstream from a sputtering station that has to deposit a very sensitive layer, e.g. a layer that is largely determinative of the light transmittance, e.g. to detect whether lighter or darker 'streaks' occur.

FIG. 11(*a*) schematically shows a cover with a fixed construction and FIG. 11(*b*) schematically shows a modularly constructed cover according to the present invention.

FIG. 11(*a*) shows a cover in which the sensor system M1 is fixedly mounted to the cover (e.g. at the bottom), and that includes e.g. a light source mounted at the bottom of the cover, and includes a sophisticated sensor that analyses and processes the light signals, and carries the result of the analysis to the outside as an electric signal, analogue or digital, e.g. using an electrical wire or wirelessly, e.g. to the computer system 540 of FIG. 5 or 640 of FIG. 6. In this case, the processing unit M2 is part of the sophisticated sensor. The notation 'M1+M2' here means that the sensor unit and the processing unit are not detachable.

FIG. 11(*b*) shows a cover which is modularly constructed, and wherein the sensor system M1 on the one hand, and the processing unit M2 on the other hand are detachable, thereby allowing that the processing unit M2 can be exchanged easily between different covers. M2 can be or comprise e.g. the multiplexer 981 and the spectrophotometer 982 of FIG. 9. Optionally the excitation source (e.g. radiation source) can also be located on the outside of the cover, and also be detachable, and thus interchangeable between different covers.

Although not shown, it will be clear to the skilled person that intermediate forms are also possible. Although the covers of FIG. 11(*b*) offer a higher degree of flexibility, the covers of FIG. 11(*a*) are also very advantageous, because they allow a very good measurement configuration to be configured with only a limited number of covers, without having to provide the most complex configuration for this purpose in each case. Indeed, depending on what (e.g. which property) and how accurately one wishes to measure the partial coating stack at a given location (station) in the sputtering device, one can adjust the desired control signal (e.g. light source) or measured signal (e.g. light spectrum) in order to achieve the desired accuracy.

FIG. 12 is a schematic representation of the main terms used in the present invention. FIG. 12 shows:

- a cover which, e.g. can include a metal plate with a flange and sealing rings or the like, to produce a hermetic seal when it is placed on a station, as known in the prior art. The cover also includes a sensor or detector, which can be a sophisticated sensor (such as e.g. the transmission detector 763 of FIG. 7), or a simple detector (e.g. the reflection detector 866 of FIG. 8). The cover further includes a transmission means, e.g. an electric wire or an optical fibre, or an RF transmitter for wireless communication, for the transmission of a wholly or partially processed signal (e.g. spectral transmission coefficients), or a non-processed signal (e.g. an optical transmission signal). Optionally, the source (e.g. the light source) can be part of the cover, such as e.g. shown in FIG. 10(*a*).
- the whole of the sensor and the transmission means, and optionally the source (e.g. in the example of FIG. 10(*a*)) is called the 'sensor system' M1.
- a 'signal processing system' M2 including at least a signal processing unit (e.g. a spectrophotometer 982, optionally preceded by an optical multiplexer). In certain cases, the signal processing unit can be part of the sensor (e.g. in the case of an integrated IC that performs both the detection and the spectral analysis). If the source is located outside of the cover, and is detachably attachable, the source can also be considered as part of the signal processing unit, because a high-quality source (e.g. high-end source with a broad spectrum) and a high-quality analysis (e.g. high-end spectrophotometer) are usually moved together.
- the whole of the sensor system M1 and the signal processing system M2 is referred to herein as the 'measuring system'.
- a computer system (e.g. 540 of FIG. 5 or 640 of FIG. 6), which comprises software for analysing the coating stack, e.g. for calculating one or more or all of the layer thicknesses of the coating stack, as described above. The result can be shown to an operator (as e.g. shown in FIG. 5), or can be used to adjust the sputtering system semi-automatically or full-automatically (as e.g. shown in FIG. 6).
- the whole of the measuring system and the computer system is referred to as the 'feedback system'.

Although not shown in FIG. 12, the computer system may optionally also be adapted to process signals obtained from an ex situ sensor system, although this is not essential.

The flexibility and the modularity offered by embodiments of the present invention will be further explained in FIG. 13 and FIG. 14.

FIG. 13 is a schematic representation of the sputtering device of FIG. 3, making use of the symbols M1 and M2 as defined in FIG. 12. In this known sputtering device, both the sensor system M1, and the signal processing system M2 are present in a station. It is (as far as it is known) fixed to a wall, not interchangeable, and not mounted to a cover. Downstream of each sputtering station a station with an in situ sensor system is present, except after the last, where an ex situ sensor system is present.

FIG. 14(*a*) to FIG. 14(*d*) show some examples of configurable measuring systems according to the present invention, especially suited for configurable sputtering devices with e.g. at least fifteen sputtering stations, although only a few stations are displayed. (the computer system is not shown in these drawings).

FIG. 14(a) shows (in station 3) a cover having attached thereto a sensor system M1, and a signal processing unit M2. This could e.g. be the sensor system such as that of FIG. 13, but now mounted at the bottom of a cover. The main advantage of this solution (compared to FIG. 13) is that this cover can be moved to other stations, e.g. to the most appropriate (e.g. most sensitive) location, so that the measuring system is configurable. This allows even a very small number of covers with sensor system to be sufficient to obtain a good quality coating stack.

FIG. 14(b) shows (in station 3) a variant of the cover of FIG. 14(a), which further also comprises a pump unit 'P'.

FIG. 14(c) shows a variant of the cover of FIG. 14(a), wherein the signal processing unit M2 is detachably attached to the sensor unit M1. The cover as a whole can be moved to other positions (such as in FIG. 14(a)), but moreover the signal processing unit M2 can also be replaced or changed (e.g. a simple versus a sophisticated processing unit), optionally together with the source.

FIG. 14(d) shows an example of a sputtering device with two covers according to the present invention, of which one cover (in the shown configuration) has not been set up functionally (it does not contain any processing unit M2), and one cover is set up functionally. This drawing is envisioned to show that the cover (with sensor system M1) can be present and remain (i.e., the vacuum does not have to be broken) at this position for two different production runs, but the sophisticated processing unit M2 can be moved from one cover to the other cover.

In a typical example, both covers may have a light source, mounted inside the vacuum chamber, and a simple detector which transmits the signal to the outside via an optical fibre. The module M2 can then be connected at the top of the cover.

Alternatively, both covers contain no light source at the bottom of the cover, but a transmission channel in order to be able to connect a light signal from outside the cover. In this case, not only the signal processing unit is moved, but also the light source, while the two covers can remain in place for the two (or more) production runs.

Of course, configurable sputtering systems may comprise a configurable measuring system or a configurable feedback system according to the present invention, having more than two covers with sensor system M1, e.g. at least five covers with sensor system M1, and e.g. four detachable processing units M2, e.g. three of normal quality, and one of high quality.

The sensor unit may be mounted on a sputtering system comprising sputter targets that contribute to the making of a sputter layer that is very sensitive to be controlled. In this case, the sensor unit should be positioned downstream of the substrate movement to be able to detect the effect of this sensitive layer. If the cover containing sputter targets that contribute to the making of a sputter layer that is very sensitive to be controlled, it may be interesting to make this cover with a sensor system independent of the exact location in the sputter installation. In certain cases, it may be important to evaluate the quality of the layer stack already present on the substrate before this sensitive layer is being deposited. This allows understanding the preceding substack and its specific properties globally or locally across the substrate width. In this case, a sensor unit may be placed at the entry of this cover carrying sputter targets. In addition, a second sensor system may be connected to the same sputter cathode as described above and located after the coating zone of the sensitive layer, meaning that it is mounted on the same cover or lid. Having two sensor systems on the same lid may prove adding value when being mounted on the sputter cathode before and after the at least one sputter target for which the layer needs to be accurately controlled. The measurement just before the sputter zone allows defining the quality of the substack while the measurement just behind the sputter zone shows the response with the added layer. An example of such a setup is shown in FIG. 15. It shows a sputtering system 400. The figure also shows three cathodes (C1, C2, C3). In this example these 3 cathodes are for sputtering the same layer. Cathode C3 has 2 targets 403. Two sensor systems 431 are present, one before the targets 403 and one after the targets 403. A feedback system, according to embodiments of the present invention comprises a computer system and the sensor systems. In FIG. 15 this feedback system is referred to as CLFS (Closed Loop Feedback System) This set-up allows for easy understanding of the effect of the layer being deposited by this cathode and the software may allow separating the response of this specific sputter zone more easily since the background response at the entry of the zone is known. The sensor system at the start of the sputter cathode and at the end of the sputter cathode may be different and may be using distinct measurement techniques and accuracies depending on the needs. Furthermore, the sensor system at the start of the sputter cathode may have a different number of sensors than the system at the end of the sputter cathode. This is illustrated in FIG. 16 which is a schematic drawing of a sputtering system 400 in accordance with embodiments of the present invention. The top view is shown. It shows two targets 403 and before and after the targets the sensor systems 431. The sensor system 431 before the targets (left side) has only one sensor (Si) whereas the sensor system 431 after the targets (right side) has a plurality of sensors (Si). A side view of the same sputtering system 400 is shown in FIG. 17. The targets 403 and sensor systems 431 are schematically drawn. In this example the sensor system 431 comprises a connection through which a gas (e.g. argon) can be blown into the sensor system. By pressurizing the sensor system at the inside it is avoided that sputtering particles enter the sensor system while sputtering. Hence, it is avoided that the sensors are damaged or contaminated by the sputtering process.

The invention claimed is:

1. A cover for a configurable measuring system of a configurable sputtering system, the configurable sputtering system being provided for sputtering multilayer coatings on a substrate, and the configurable sputtering system comprising a plurality of stations and having a plurality of apertures to provide access to a space within the stations;

the cover being detachably attachable to each of the apertures of the stations individually, such that the cover closes one aperture at a time and is movable from one aperture to another;

the cover comprising a sensor system allowing to determine a property of a substrate with or without a stack of the multilayer coating on the substrate by directly measuring on the substrate, the sensor system comprising at least one sensor adapted for detecting or measuring a signal representative of the property of the substrate with or without the stack in one of the plurality of stations, and comprising at least one first transmission means for transferring or transmitting the detected signal or the determined property;

the at least one sensor being attached to the cover, such that moving the cover from one of the plurality of stations to another allows detecting or measuring the signal representative of the property of the substrate with or without the stack in the other station.

2. The cover according to claim 1, further comprising:
a source placed at an inner side of the cover, the source being adapted for generating a source signal having a predetermined characteristic.

3. The cover according to claim 1, further comprising:
a source placed at an outer side of the cover, the source being adapted for generating a source signal having a predetermined characteristic, and
a second transmission means connectable to the source, the second transmission means being adapted for transferring or transmitting a signal originating from the source to the substrate.

4. The cover according to claim 1, further comprising:
a second transmission means connectable to an external source, the second transmission means being adapted for transferring or transmitting a signal originating from the external source to the substrate.

5. The cover according to claim 1, the sensor system comprising an optical sensor, adapted for measuring or transferring an optical signal originating from the partial stack.

6. The cover according to claim 1, the at least one sensor having a fixed position relative to the cover.

7. The cover according to claim 1, wherein the cover further comprises at least one rail, and wherein the at least one sensor is movable along the at least one rail or wherein the sensor system includes a plurality of sensors, located throughout the at least one rail.

8. A configurable measuring system for use in a configurable sputtering system for measuring a partial stack of a multilayer coating, comprising:
at least one cover according to claim 1;
a signal processing unit for processing at least one signal originating from the at least one sensor of the sensor system of the at least one cover.

9. A configurable measuring system, according to claim 8, wherein the signal processing unit is detachably attached to the outside of the cover, such that the signal processing unit is interchangeable between covers without having to disassemble the cover.

10. A configurable measuring system according to claim 8, further comprising the source, detachably mounted on the outside of the cover and detachably connected to the second transmission means.

11. A feedback system comprising:
a configurable measuring system according to claim 8;
a computer system provided with software for determining a property of at least one layer of the multilayer coating based on measurement data from the configurable measuring system.

12. A feedback system according to claim 11, further comprising:
an ex situ sensor system adapted for measuring a property of the multilayer coating;
wherein the software is further adapted for determining a property of at least one layer of the multilayer coating based on data from the configurable measuring system, and based on the data from the ex situ sensor system.

13. A feedback system according to claim 11, for use in a configurable sputtering system that comprises at least one control mechanism, that allows to locally influence the sputtering process which takes place in the sputtering system; the computer system and the software being further adapted for providing a control signal for adjusting the sputtering process based on data from the sensor system.

14. A feedback system according to claim 13, for use in a configurable sputtering system comprising at least one sputtering target with at least two on-line adjustable magnets;
the sensor system being adapted for measuring a property of the layer applied by said sputtering target to at least two laterally different positions on the substrate;
the computer system and the software being further adapted for providing at least one control signal for the online adjustment of the on-line adjustable magnets based on the data originating from the sensor system.

15. A feedback system according to claim 11, wherein the computer system and the software are further adapted for providing a control signal for the automatic adjustment of at least one of the sputtering parameters chosen from the group consisting of: power of a sputtering target, spatially distributed partial gas pressure in the sputtering system, positions of on-line adjustable magnets of at least one sputtering target, positions and apertures of the shields.

16. A method for configuring a configurable measuring system or a feedback system for a configurable measuring system according to claim 11, the method comprising the following steps:
providing at least one cover with a sensor system;
choosing an appropriate position for the cover in the sputtering device, as a function of the envisioned composition of at least one multilayer coating;
detachably attaching the cover to an aperture of the chosen appropriate position.

17. A method for configuring a configurable measuring system according to claim 16, the method comprising the following steps:
providing at least two covers with a sensor system;
providing at least one signal processing unit;
choosing an appropriate position for the at least two covers in the sputtering device, based on the envisioned composition of at least two multilayer coatings to be produced;
detachably attaching the cover to the apertures of the chosen appropriate positions;
choosing an appropriate position for the at least one signal processing unit on one of the at least two covers, based on the multilayer coatings to be produced;
detachably attaching the at least one signal processing unit to the chosen cover.

18. A configurable sputtering system for sputtering multilayer coatings with varying compositions on a substrate;
the sputtering system comprising a plurality of stations, and having a plurality of apertures to provide access to a space within the stations;
and further comprising a configurable measuring system according to claim 8.

19. A method of applying a multilayer coating on a substrate, comprising the following steps:
configuring a configurable measuring system or a configurable feedback system according to claim 16;
calibrating the configurable measuring system;
measuring a property of the partial coating stack applied to the substrate making use of the configurable measuring system;
calculating a deviation of the measured property with respect to an envisioned property of the partial coating stack;

adjusting at least one parameter of the sputtering system based on the calculated deviation.

20. A method according to claim 19, further comprising a step of:

calibrating the measuring system during production.

21. A method according to claim 19, wherein the sputtering system comprises at least one sputtering target having a plurality of on-line adjustable magnets, and wherein the method further comprises a step:

for measuring a property at multiple locations over substantially the entire width of the substrate, and for automatically adjusting the on-line adjustable magnets in order to minimise deviations of the deposited coating stack with respect to the predefined coating stack.

22. A method according to claim 19, wherein the sputtering system comprises at least one sputtering target having a plurality of on-line adjustable magnets, and wherein the method comprises a step:

of measuring or determining a property of a partial coating stack on a substrate, deposited in a first sputtering zone of the sputtering system, and for calculating a deviation of the measured or determined property with respect to envisioned properties, and proposing an adjustment to correct the deviation or automatically adjusting the on-line adjustable magnets of a sputtering target in a second sputtering zone, at a time when said substrate enters the second sputtering zone, the automatic adjustment being such that the calculated deviation of the partial coating stack is at least partially compensated by the layer that will be applied in the second sputtering zone by the adjusted on-line adjustable magnets.

23. A cover for a configurable measuring system of a configurable sputtering system, the configurable sputtering system being provided for sputtering multilayer coatings on a substrate, and the configurable sputtering system comprising a plurality of stations and having a plurality of apertures to provide access to a space within the stations;

the cover being detachably attachable to each of the apertures of the stations individually, such that the cover closes one aperture at a time and is movable from one aperture to another;

the cover comprising:

a vacuum pump, a sputtering target, and a sensor system allowing to determine a property of a substrate with or without a stack of the multilayer coating on the substrate by directly measuring on the substrate, the sensor system comprising at least one sensor adapted for detecting or measuring a signal representative of the property of the substrate with or without the stack in one of the plurality of stations, and comprising at least one first transmission means for transferring or transmitting the detected signal or the determined property;

the at least one sensor being attached to the cover;

wherein the cover further comprises at least one rail, and wherein the at least one sensor is mounted on the at least one rail and is movable along the at least one rail.

24. The cover according to claim 2, wherein the at least one sensor includes an integrating sphere that evenly divides light from a light source.

* * * * *